(12) United States Patent
Petrov

(10) Patent No.: US 8,837,618 B2
(45) Date of Patent: Sep. 16, 2014

(54) TRANSMISSION PROCESSING METHOD, TRANSMITTER, RECEPTION PROCESSING METHOD, AND RECEIVER

(75) Inventor: Mihail Petrov, Dresden (DE)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/124,071

(22) PCT Filed: Jun. 14, 2012

(86) PCT No.: PCT/JP2012/003889
§ 371 (c)(1),
(2), (4) Date: Dec. 5, 2013

(87) PCT Pub. No.: WO2012/172804
PCT Pub. Date: Dec. 20, 2012

(65) Prior Publication Data
US 2014/0126672 A1    May 8, 2014

(30) Foreign Application Priority Data
Jun. 16, 2011    (EP) .................................... 11004946

(51) Int. Cl.
| | | |
|---|---|---|
| H04L 5/12 | (2006.01) | |
| H04L 27/36 | (2006.01) | |
| H03K 9/10 | (2006.01) | |
| H03M 13/11 | (2006.01) | |
| H03M 13/00 | (2006.01) | |
| H04L 1/00 | (2006.01) | |
| H03M 13/25 | (2006.01) | |
| H04L 27/34 | (2006.01) | |

(52) U.S. Cl.
CPC ....... *H04L 27/3405* (2013.01); *H03M 13/1165* (2013.01); *H03M 13/6552* (2013.01); *H04L 1/0061* (2013.01); *H03M 13/255* (2013.01)
USPC ............................ 375/261; 375/298; 375/323

(58) Field of Classification Search
USPC .................................. 375/260, 261, 298, 323
See application file for complete search history.

(56) References Cited

U.S. PATENT DOCUMENTS

| | | | |
|---|---|---|---|
| 7,801,243 B2* | 9/2010 | Kim et al. ...................... 375/295 |
| 2011/0164688 A1* | 7/2011 | Kim et al. ................. 375/240.25 |
| 2012/0069922 A1* | 3/2012 | Taylor et al. ................... 375/260 |
| 2012/0189079 A1* | 7/2012 | Taylor et al. ................... 375/295 |

FOREIGN PATENT DOCUMENTS

| | | |
|---|---|---|
| EP | 2 254 249 | 11/2010 |
| EP | 2 254 250 | 11/2010 |
| JP | 2009-225416 | 10/2009 |

(Continued)

OTHER PUBLICATIONS

International Search Report issued Aug. 28, 2012 cin International (PCT) Application No. PCT/JP2012/003889.

(Continued)

*Primary Examiner* — Don N Vo
(74) *Attorney, Agent, or Firm* — Wenderoth, Lind & Ponack, L.L.P.

(57) ABSTRACT

Information bits are encoded according to a low density parity check code with code rate 7/15 and a codeword length of 16200. The resulting codeword bits are bit-interleaved and the interleaved bits are demultiplexed into 8 sequences of bits. The 8 sequences of bits are permuted according to a predetermined permutation rule: $v_0=b_2$, $v_1=b_6$, $v_2=b_0$, $v_3=b_1$, $v_4=b_4$, $v_5=b_5$, $v_6=b_3$, $v_7=b_7$.

4 Claims, 25 Drawing Sheets

(56) References Cited

FOREIGN PATENT DOCUMENTS

| WO | 2009/104319 | 8/2009 |
|---|---|---|
| WO | 2009/107990 | 9/2009 |
| WO | 2009/109830 | 9/2009 |
| WO | 2009/116204 | 9/2009 |

OTHER PUBLICATIONS

Written Opinion of the International Searching Authority issued May 3, 2013 in International (PCT) Application No. PCT/JP2012/003889.
Digital Video Broadcasting (DVB); Frame structure channel coding and modulation for a second generation digital transmission system for cable systems (DVB-C2), ESTI EN 302 769 V1.2.1 (Apr. 2011), pp. 35-36 (partial).
Digital Video Broadcasting (DVB); Frame structure channel coding and modulation for a second generation digital terrestrial television broadcasting system (DVB-T2), ETSI EN 302 755 V1.2.1 (Feb. 2011).
Makiko Kan, "New 16k LDPC Codes for DVB-NGH", with filename: "TM-NGH580_NGH_sony_New_16k_Codes.pdf", document-ID TM-H1115 and published on Dec. 12, 2010.
Digital Video Broadcasting (DVB); Second generation framing structure, channel coding and modulation systems for Broadcasting, Interactive Services, News Gathering and other broadband satellite applications (DVB-S2), ETSI EN 302 307 V1.2.1 (Aug. 2009), Apr. 24, 2009 to Aug. 24, 2009.
Digital Video Broadcasting (DVB); Next Generation broadcasting system to Handheld, physical layer specification (DVB-NGH), Draft ETSI EN ngh ngh V1.1.1 (Jun. 2012), DVB Organization: "TM-NGH1181r10_en _nghnghv010101_120606_worm_woc.pdf", DVB, Digital Video Broadcasting, C/O EBU 17A Anicienne Route-CH-1218 Grand Saconnex, Geneva-Switzerland, Jun. 12, 2012, XP017839126, p. 48-p. 53, p. 203.
Makiko Kan, "Updated Data for New 16K LDPC Codes", DVB Organization: "TM-NGH643_20110120_sony_New 16k_Codes2.pdf" DVB, Digital Video Broadcasting, C/O EBU 17A Ancienne Route-CH-1218 Grand Saconnex, Geneva-Switzerland, Feb. 16, 2011, XP017834323, pp. 5,6.
"LG Response to NGH Call for Technology" DVB Organization: "TM-NGH076r1_LG_response_to_NGH_CfT.pdf", DVB, Digital Video Broadcasting, C/O EBU 17A Ancienne Route-CH-1218 Grand Saconnex Geneva-Switzerland, Mar. 20, 2010, XP017832100, p. 14-p. 23.
Supplementary European Search Report issued Jun. 28, 2013 in European Application No. Ep 12 79 7677.
Supplementary European Search Report issued Sep. 28, 2011 in European Application No. Ep 11 00 4946.

\* cited by examiner

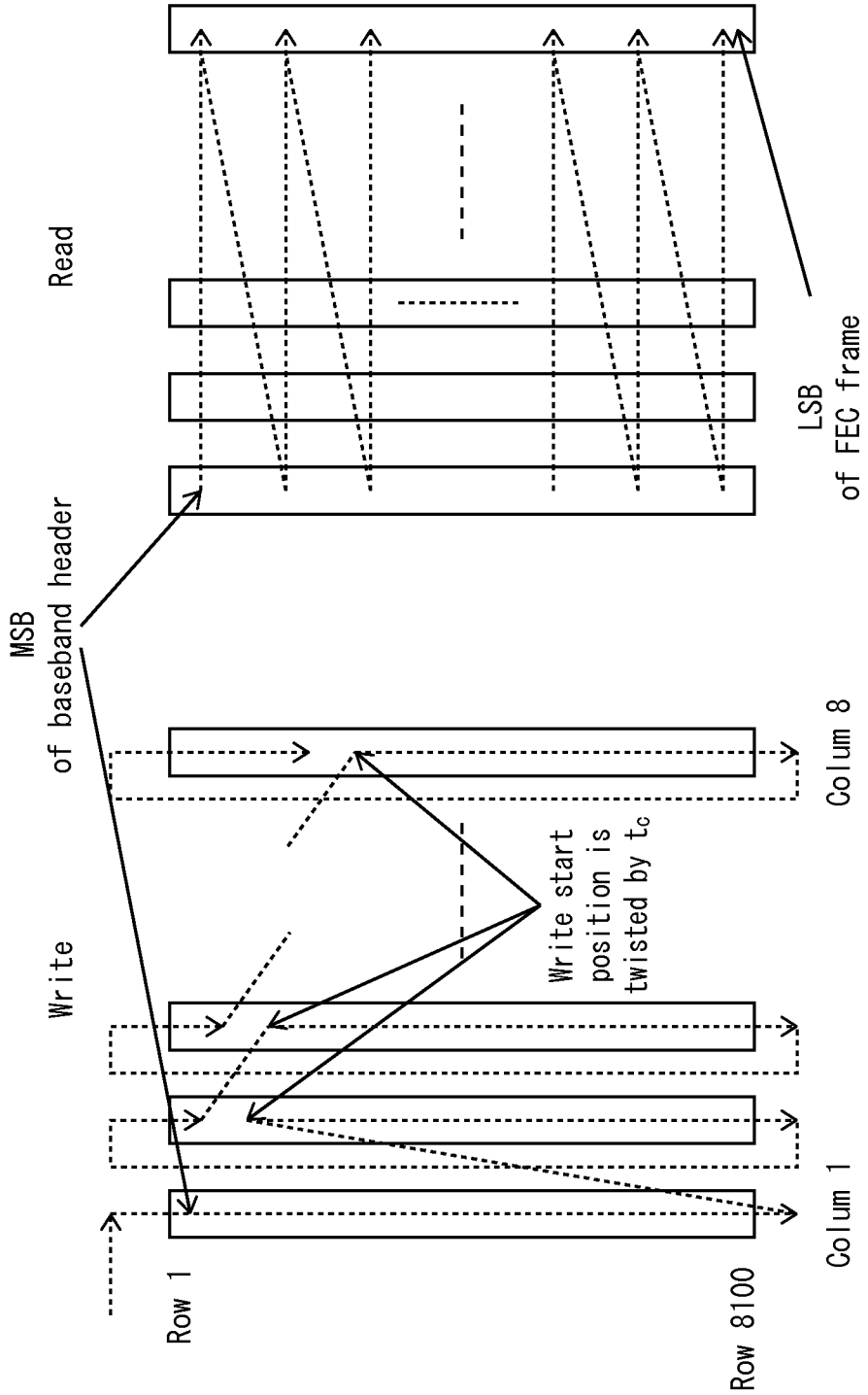

■ = First bit of the LDPC codeword (FEC frame)

FIG. 25

Addresses of the parity bit accumulators for the LDPC code of code rate 7/15 and codeword length 16200

```
Addresses of the parity bit accumulators for the LDPC code of code rate 8/15 and codeword length 16200

32  384  430  591 1296 1976 1999 2137 2175 3638 4214 4304 4486 4662 4999 5174 5700 6969 7115 7138 7189
1788 1881 1910 2724 4504 4928 4973 5616 5686 5718 5846 6523 6893 6994 7074 7100 7277 7399 7476 7480 7537
2791 2824 2927 4196 4298 4800 4948 5361 5401 5688 5818 5862 5969 6029 6244 6645 6962 7203 7302 7454 7534
 574 1461 1826 2056 2069 2387 2794 3349 3366 4951 5826 5834 5903 6640 6762 6786 6859 7043 7418 7431 7554
  14  178  675  823  890  930 1209 1311 2898 4339 4600 5203 6485 6549 6970 7208 7218 7298 7454 7457 7462
4075 4188 7313 7553
5145 6018 7148 7507
3198 4858 6983 7033
3170 5126 5625 6901
2839 6093 7071 7450
  11 3735 5413
2497 5400 7238
2067 5172 5714
1889 7173 7329
1795 2773 3499
2695 2944 6735
3221 4625 5897
1690 6122 6816
5013 6839 7358
1601 6849 7415
2180 7389 7543
2121 6838 7054
1948 3109 5046
 272 1015 7464
```

TRANSMISSION PROCESSING METHOD, TRANSMITTER, RECEPTION PROCESSING METHOD, AND RECEIVER

TECHNICAL FIELD

The present invention relates to a method for processing a digital signal in a transmitting side, and in particular to bit permutation patterns applied to bits before being input to the mapper. Furthermore, the present invention relates to a method for processing a digital signal in a receiving side, and in particular to bit permutation patterns applied to bits after being output by the demapper. Additionally, the present invention relates to a transmitter and a receiver for performing the methods.

BACKGROUND ART

In recent years, transmitters are provided with a bit-interleaved coding and modulation (BICM) encoder (see, Non-Patent Literature 1, for example).

A BICM encoder performs the following steps, for example.

(1) Encoding data blocks by using a BCH (Bose-Chaudhuri-Hocquenghem) code as an outer code and a Low-Density Parity-Check (LDPC) code as an inner code, for example.

(2) Applying bit-interleaving, which involves parity interleaving and column-row interleaving, to the codeword bits obtained as a result of the encoding.

(3) Demultiplexing the bit-interleaved codeword to obtain cell words. The demultiplexing includes processing equivalent to a permutation of the columns of an interleaver matrix used in the column-row interleaving when the type of modulation being used is 16QAM, 64QAM or 256QAM, for example.

(4) Mapping the cell words onto constellations.

CITATION LIST

Non-Patent Literature

[Non-Patent Literature 1]
ETSI EN 302 755 V1.2.1 (DVB-T2 standard)
[Non-Patent Literature 2]
"New 16 k LDPC codes for NGH" by Makiko Kan, with filename: "TM-NGH580_NGH_sony_New_16k_Codes.pdf", document-ID TM-H1115 and published on Dec. 12, 2010 (available from www.dvb.org)
[Non-Patent Literature 3]
ETSI EN 302 307 V1.2.1 (DVB-T2 standard)

SUMMARY OF INVENTION

Technical Problem

The reception performance of a receiver can be improved by appropriately optimizing the rules of permutations (including the bit-interleaving numbered (2) above and the permutation carried out in the demultiplexing numbered (3) above) applied to the LDPC codeword bits prior to mapping to be suitable for the LDPC code and constellation used by the transmitter and receiver.

The present invention aims to provide a transmission processing method and reception processing method according to which the permutation rules applied to the LDPC codeword bits prior to being mapped are optimized for the LDPC codes and constellations used by the transmitter and receiver, thereby improving the reception performance of the receiver. The present invention also aims to provide a transmitter and receiver executing the transmission processing method and reception processing method, respectively.

Solution to Problem

In order to achieve the above aims, a transmission processing method according to the present invention includes:

an encoding step of encoding information bits into a codeword according to a low density parity check code with code rate 7/15 and a codeword length of 16200, the low density parity check code shown in FIG. 25;

a bit-interleaving step of conducting parity interleaving and column-row interleaving on bits of the codeword obtained in the encoding step, the column-row interleaving being conducted with or without twist;

a bit-to-cell demultiplexing step of demultiplexing a sequence of bits interleaved in the bit-interleaving step into 8 sequences of bits and permuting the 8 sequences of bits according to a predetermined permutation rule; and a mapping step of mapping each of 8-bit cell words obtained as a result of the demultiplexing in the bit-to-cell demultiplexing step, according to a 256QAM (Quadrature Amplitude Modulation) constellation, wherein letting $v_i$ denote a bit in the $i^{th}$ sequence of bits before the permutation (for i=0, 1, ... 7), and letting $b_i$ denote a bit in the $i^{th}$ sequence of bits after the permutation (for i=0, 1, ... 7), the predetermined permutation rule is:
$v_0=b_2, v_1=b_6, v_2=b_0, v_3=b_1, v_4=b_4, v_5=b_5, v_6=b_3, v_7=b_7$.

SUMMARY OF INVENTION

According to the transmission processing method described above, the permutation rules to be applied to the LDPC codeword bits prior to being mapped are optimized for the LDPC codes and constellations used by the transmitter and receiver, which is advantageous to improve the reception performance of the receiver.

BRIEF DESCRIPTION OF DRAWINGS

FIG. 4 illustrates the working principle of column-row interleaving with twist, carried out by the column-row interleaver shown in FIG. 2.

FIG. 25 shows the LDPC code for a codeword length of 16200 bits and code rate 7/15.

FIG. 26 shows the LDPC code for a codeword length of 16200 bits and code rate 8/15.

DESCRIPTION OF EMBODIMENTS

Findings by Present Inventor Leading to the Invention

DVB-T2 (Digital Video Broadcasting—Second Generation Terrestrial) (ETSI EN 302 755: Non-Patent Literature 1) is improvement of DVB-T, which is the standard for television, and describes a second generation baseline transmission system for digital terrestrial television. More specifically, ETSI EN 302 755 (Non-Patent Literature 1) describes the details of the channel coding/modulation system intended for digital television services and generic data streams.

Figure 1:
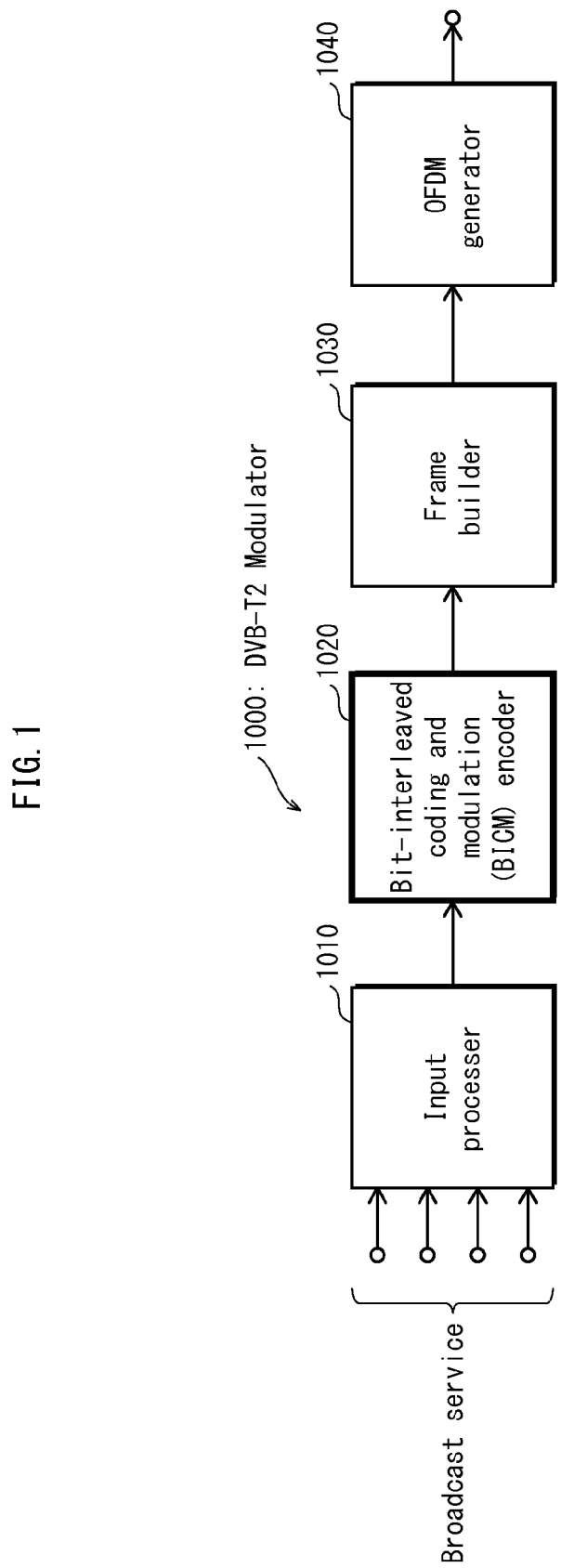
FIG. 1 is an overview of a DVB-T2 modulator.

FIG. 1 is an overview of a DVB-T2 modulator complaint with the DVB-T2 system architecture (fundamental design concept). The DVB-T2 modulator 1000 includes an input processor 1010, a bit-interleaved coding and modulation (BICM) encoder 1020, a frame builder 1030, and an OFDM generator 1040.

The input processor 1010 formats input bit streams relating to a broadcast service into blocks of a predetermined length. The BICM encoder 1020 applies BICM encoding based on DVB-T2 to the input. The frame builder 1030 assembles transmission frames for transmission in DVB-T2 from the inputs received from the BICM encoder 1020, and the like. The OFDM generator 1040 processes the frame structure for DVB-T2 transmission by adding pilots, applying Inverse Fast Fourier Transform, inserting guard intervals to output DVB-T2 transmission signals.

The BICM based on DVB-T2 is described in Clause 6 of ETSI EN 302 755 (Non-Patent Literature 1), the entirety of which is incorporated by reference.

Figure 2:
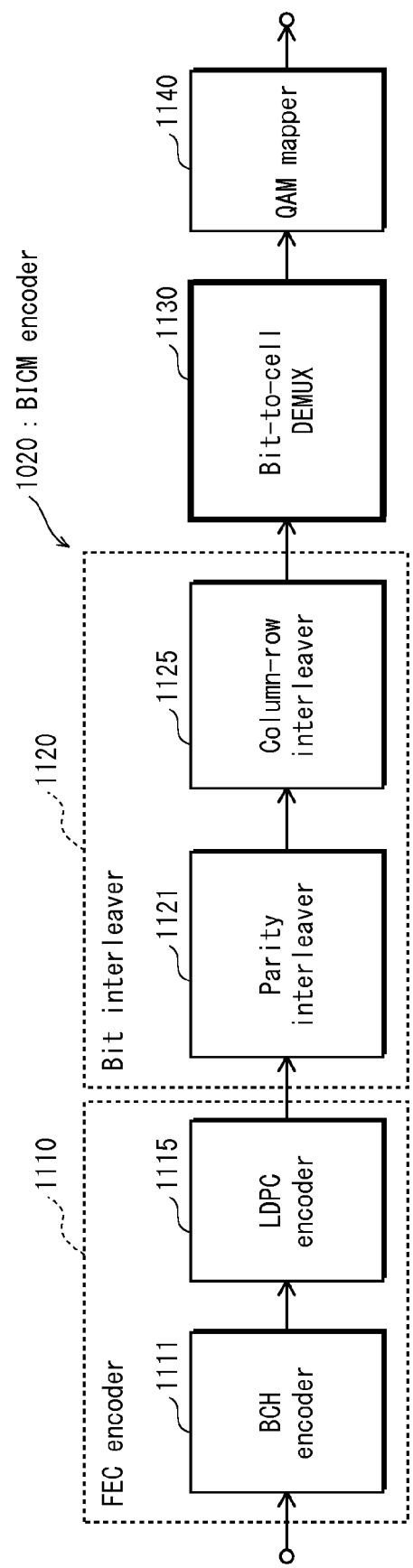
FIG. 2 is a block diagram of the BICM encoder shown in FIG. 1.

The following describes the details of the BICM encoder 1020 shown in FIG. 1, with reference to FIG. 2.

FIG. 2 is a block diagram of the BICM encoder 1020 included in the DVB-T2 modulator 1000 shown in FIG. 1.

The BICM encoder 1020 includes an FEC encoder 1110, a bit interleaver 1120, a bit-to-cell demultiplexer 1130, and a QAM mapper 1140. In FIG. 2, the constellation rotation, the cell interleaver, and the time interleaver are omitted.

Basically, the procedure for BICM encoding according to DVB-T2 involves the forward-error-correction (FEC) encoding, interleaving the codeword bits resulting from the FEC encoding, demultiplexing the interleaved bits into cell words, and mapping the cell words onto complex QAM (Quadrature Amplitude Modulation) symbols (which are also referred to as cells).

The FEC encoder 1110 is composed by concatenating a BCH (Bose-Chaudhuri-Hocquenghem) encoder (systematic BCH outer encoder) 1111 and an LDPC (low-density parity check) encoder (systematic LDPC inner encoder) 1112.

Figure 3:
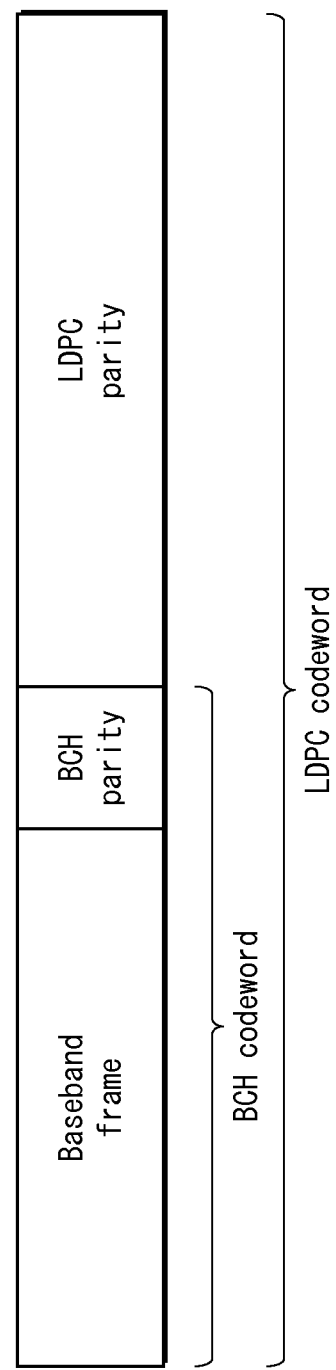
FIG. 3 shows an LDPC codeword, composed of a baseband frame, BCH parity part, and LDPC parity part.

As shown in FIG. 3, the BCH encoder 1111 generates BCH parity bits by BCH encoding a baseband frame and outputs, to the LDPC encoder 1115, a BCH codeword to which the BCH parity bits are appended. Then, the LDPC encoder 1115 encodes the BCH codeword with LDPC to generate LDPC parity bits and outputs to the bit interleaver 1120 LDPC codeword to which the LDPC parity bits are appended, as shown in FIG. 3.

The codeword length of the LDPC codeword (i.e., the number of bits of an LDPC coded block, which may also be referred to as FEC frame) according to the DVB-T2 standard is 64800 bits or 16200 bits. The DVB-T2 standard specifies LDPC codes for both codeword lengths. However, only codeword length 16200 is relevant to the present invention as will be explained later. The LDPC code provides most of the error-correction capability of the system, while the BCH code reduces the remaining error floor after LDPC decoding.

The bit interleaver 1120 includes a parity interleaver 1121 and a column-row interleaver 1125.

The parity interleaver 1121 interleaves the parity bits of the systematic LDPC codeword. Then, the column-row interleaver 1125 interleaves the LDPC codeword bits resulting from the parity interleaving by column-row interleaving.

Subsequently, the bit-to-cell demultiplexer 1130 demultiplexes the LDPC codeword bits resulting from the bit-interleaving to cell words prior to mapping to QAM constellations. Note that the demultiplexing involves the process equivalent to a permutation of the columns of the interleaver matrix of the column-row interleaver 1125 (a process of rearranging the order of the columns of the interleaver matrix).

The constellation rotation, the cell interleaving or the time interleaving, which will be performed subsequently to the process performed by the bit-to-cell demultiplexer 1130, will not be discussed in detail, in order to facilitate the explanation and in view of not being of relevance for the understanding of the principles of the present invention.

The QAM mapper 1140 maps the cell words onto the QAM constellations.

The LDPC codes are linear error correction codes for transmitting a message over a noisy transmission channel. The LDPC codes are finding increasing use in applications where reliable and highly efficient information transfer over bandwidth or return-channel constrained links in the presence of data-corrupting noise is desired. LDPC codes are defined by a sparse parity-check matrix (i.e., a parity-check matrix in which only few entries are ones).

The LDPC encoder 1115 of DVB-T2 treats the output of the BCH encoder 1111 as an information block and systematically encodes the information block onto an LDPC codeword. The task of the LDPC encoder 1115 is to compute the parity bits for every information block, input to the LDPC encoder 1115, i.e. for every BCH codeword. The processing of the LDPC encoder 1115 uses the particular codes as listed in tables A.1 through A.6 included in Annex A of the DVB-T2 standard 302.755 (Non-Patent Literature 1).

It should be noted that the bits of an LDPC codeword have different importance levels, while the bits of a constellation codeword length 16200 bits. In DVB-T2 a column-row interleaver is not used for QPSK (4QAM) constellations.

TABLE 1

| Modulation | Columns $N_c$ | Rows $N_r$ |
|---|---|---|
| 16QAM | 8 (2 × 4) | 2025 |
| 64QAM | 12 (2 × 6) | 1350 |
| 256QAM | 8 (1 × 8) | 2025 |

The write start position of every column is twisted (i.e. cyclically shifted) by the twisting parameter $t_c$ according to Table 2. In Table 2, the twisting parameter $t_c$ of all columns of the interleaver matrix is listed for all relevant constellation sizes (referred to as "modulation" in Table 2) and LDPC codeword lengths $N_{ldpc}$ of an LDPC codeword.

TABLE 2

| Modulation | Columns $N_c$ | LDPC codeword length $N_{ldpc}$ | Twisting Parameter $t_c$ |||||||||||||||
|---|---|---|---|---|---|---|---|---|---|---|---|---|---|---|---|---|---|
| | | | Column 0 | 1 | 2 | 3 | 4 | 5 | 6 | 7 | 8 | 9 | 10 | 11 | 12 | 13 | 14 | 15 |
| 16-QAM | 8 | 64800 | 0 | 0 | 2 | 4 | 4 | 5 | 7 | 7 | — | — | — | — | — | — | — | — |
| | | 16200 | 0 | 0 | 0 | 1 | 7 | 20 | 20 | 21 | — | — | — | — | — | — | — | — |
| 64-QAM | 12 | 64800 | 0 | 0 | 2 | 2 | 3 | 4 | 4 | 5 | 5 | 7 | 8 | 9 | — | — | — | — |
| | | 16200 | 0 | 0 | 0 | 2 | 2 | 2 | 3 | 3 | 3 | 6 | 7 | 7 | — | — | — | — |
| 256-QAM | 16 | 64800 | 0 | 2 | 2 | 2 | 2 | 3 | 7 | 15 | 16 | 20 | 22 | 22 | 27 | 27 | 28 | 32 |
| | 8 | 16200 | 0 | 0 | 0 | 1 | 7 | 20 | 20 | 21 | — | — | — | — | — | — | — | — | have different robustness levels. A straightforward (i.e. non-interleaved) mapping of the LDPC codeword bits to the constellation symbols leads to a suboptimal performance. This is the reason why the bit interleaver 1120 as well as the bit-to-cell demultiplexer 1130 is used between the LDPC encoder 1115 and the QAM mapper 1140. In other words, the bit interleaver 1120 and the bit-to-cell demultiplexer 1130 allow achieving an improved association between the bits of the encoded LDPC codeword and the bits carried by the QAM constellations.

The different importance levels of the bits of an LDPC codeword results from the fact that not all these bits are involved in the same number of parity-checks, as defined by the parity-check matrix. The more parity-checks (i.e. check nodes) a bit (i.e. variable node) is connected to, the more important that bit is in the iterative decoding process. This aspect is well understood in the art.

Likewise, the different importance levels of the bits encoded in a QAM constellation is a fact well known by the person skilled in the art. For example, a 16QAM constellation encodes four bits and has two robustness levels. A 64QAM constellation encodes six bits and has three robustness levels. A 256QAM constellation encodes eight bits and has four robustness levels.

Further to the DVB-T2 standard, the column-row interleaver 1125 of the bit interleaver 1120 performs the column-row interleaving process, which is equivalent to a process of serially writing column-wise the data bits received from the parity interleaver 1121 into an interleaver matrix, cyclically shifting (referred to as twisting) each column by a specified number of bits, and serially reading out the bits row-wise. The first bit of the LDPC codeword (FEC frame) is written and read out first.

In the column-row interleaving, an interleaver matrix with $N_c$ columns and $N_r$ rows is defined. These two parameters ($N_c$ and $N_r$) are listed in Table 1 for all relevant constellation sizes (referred to as "modulation" in Table 1) and LDPC codes of FIG. 4 shows a process performed by the column-row interleaver 1125, assuming that a long frame with 64800 bits is generated by the FEC encoder 1110 (which includes the BCH encoder 1111 and LDPC encoder 1115) and that a 16QAM constellation is used as the QAM constellation. Correspondingly, the interleaver matrix has 8100 rows and 8 columns.

As shown in FIG. 4, the column-row interleaver 1125 serially writes the data bits, which are received from the parity interleaver 1121, column-wise into an interleaver matrix with twist. In the process of twisting, the write start position of each column is twisted by using the twisting parameter $t_c$ shown in Table 2. Subsequently, the column-row interleaver 1125 serially reads out the bits row-wise from the interleaver matrix. The MSB (most significant bit) of the baseband frame header is written and read out first. Note that the "LSB of FEC Frame" in FIG. 4 refers to the LSB (least significant bit) of the FEC frame after column-row interleaving with twist (i.e., column twist interleaving).

FIGS. 5A, 5B, 6A, and 6C show an example of column-row interleaving for LDPC codewords of codeword length 16200 bits, for a number of columns equal to 8 and 12 respectively.

Figure 5B:
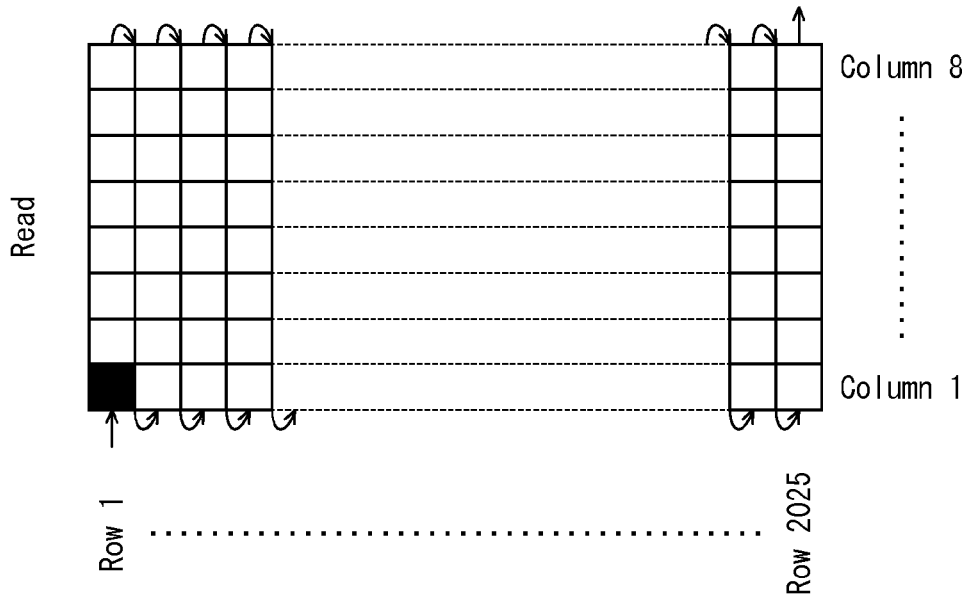
FIG. 5B illustrates a read process performed by the column-row interleaver to read the bits of the LDPC codeword written in the process illustrated in FIG. 5A.
Figure 5A:
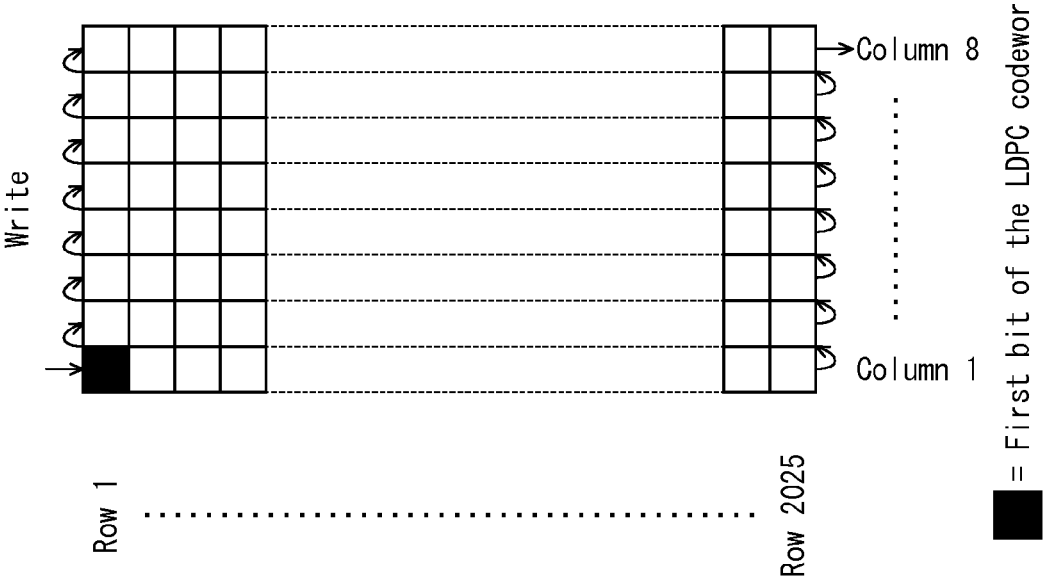
FIG. 5A illustrates a write process performed by a column-row interleaver having 8 columns to write bits of an LDPC codeword with a codeword length of 16200 bits.
Figure 6B:
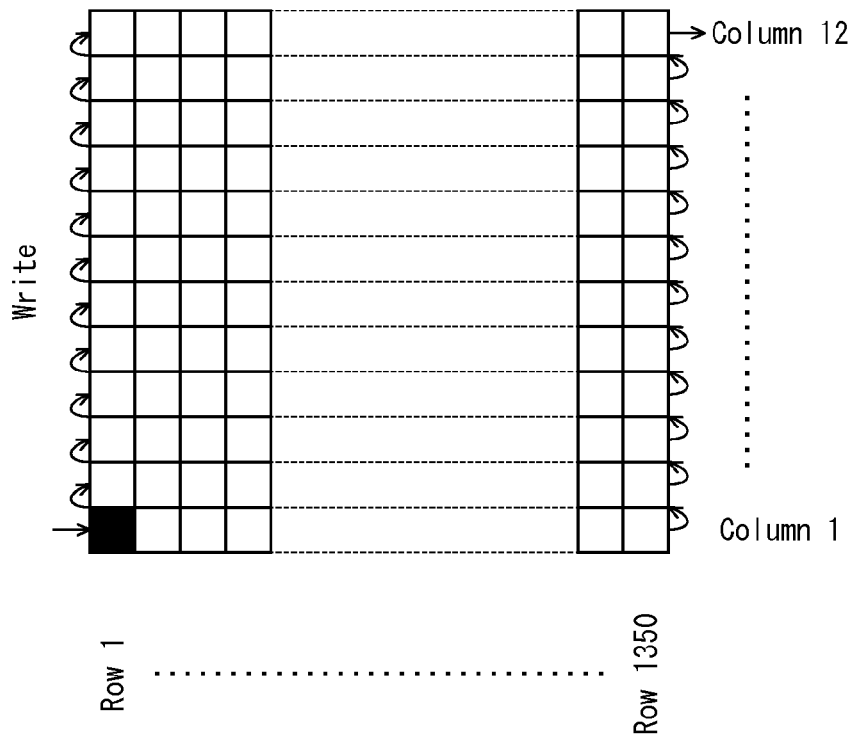
FIG. 6B illustrates a read process performed by the column-row interleaver to read the bits of the LDPC codeword written in the process illustrated in FIG. 6A.
Figure 6A:
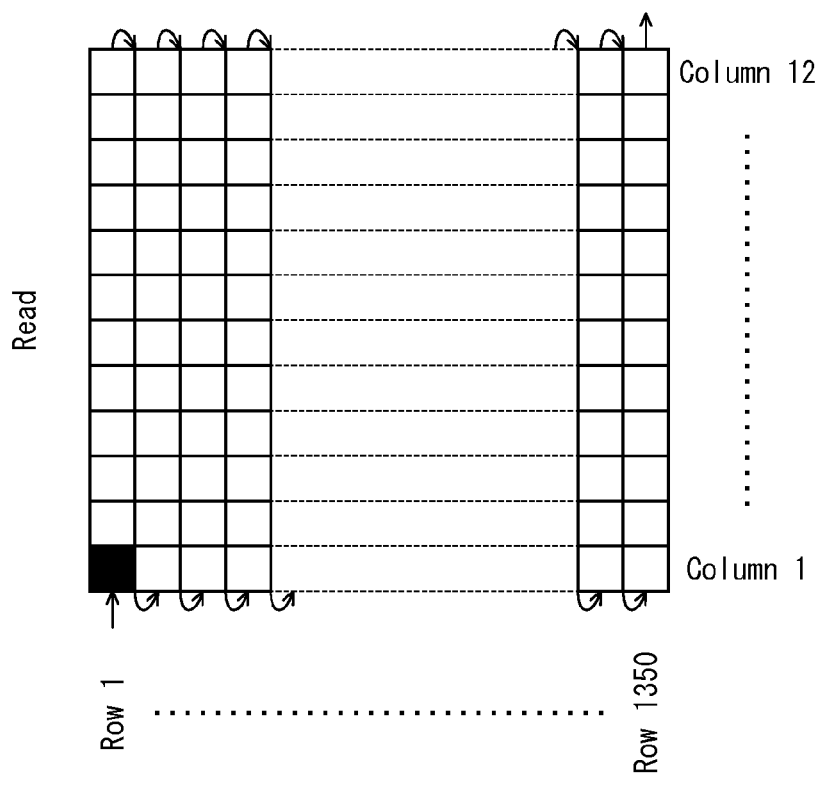
FIG. 6A illustrates a write process performed by a column-row interleaver having 12 columns to write bits of an LDPC codeword with a codeword length of 16200 bits.

More specifically, FIGS. 5A and 6A are relevant to the writing of bits by the column-row interleaver 1125, whereas FIGS. 5B and 6B are relevant to the reading of bits by the column-row interleaver 1125. In each figure, each smallest square represents one bit of the LDPC codeword, and each black square represents the first bit of the LDPC codeword. In addition, the arrow indicates the order in which the bits are written into or read out of the interleaver matrix. Note that the process of twisting is not shown in FIGS. 5A, 5B, 6A, and 6B.

Suppose that the interleaver matrix has 8 columns, the LDPC codeword bits are written in the order of (row 1, column 1), (row 2, column 1), . . . (row 2025, column 1), (row 1, column 2), . . . (row 2025, column 8), as shown in FIG. 5A, and read out in the order of (row 1, column 1), (row 1, column 2), ... (row 1, column 8), (row 2, column 1), ... (row 2025, column 8), as shown in FIG. 5B.

Note that only two cases, which are (1) LDPC codewords of codeword length 16200, for a number of columns equal to 8, and (2) LDPC codewords of codeword length 16200, for a number of columns equal to 12 are relevant for the present invention.

Prior to the QAM mapping, each LDPC codeword having been bit-interleaving by the bit interleaver 1120 is first demultiplexed into parallel cell words by the bit-to-cell demultiplexer 1130. Each cell word demultiplexed contains as many bits as are encoded in one QAM constellation ($\eta_{MOD}$), that is, 2 bits for QPSK (4QAM) constellation, 4 bits for 16QAM constellation, 6 bits for 64QAM constellation, and 8 bits for 256QAM constellation. The resulting number of QAM data cells per LDPC codeword (FEC block) of codeword length 16200 bits is therefore $16200/\eta_{MOD}$. That is, 8100 cells for QPSK, 4050 cells for 16QAM, 2700 cells for 64QAM, and 2025 cells for 256QAM.

The following now describes the bit-to-cell demultiplexer 1130 shown in FIG. 2, with reference to FIGS. 7 through 10.

Figure 7:
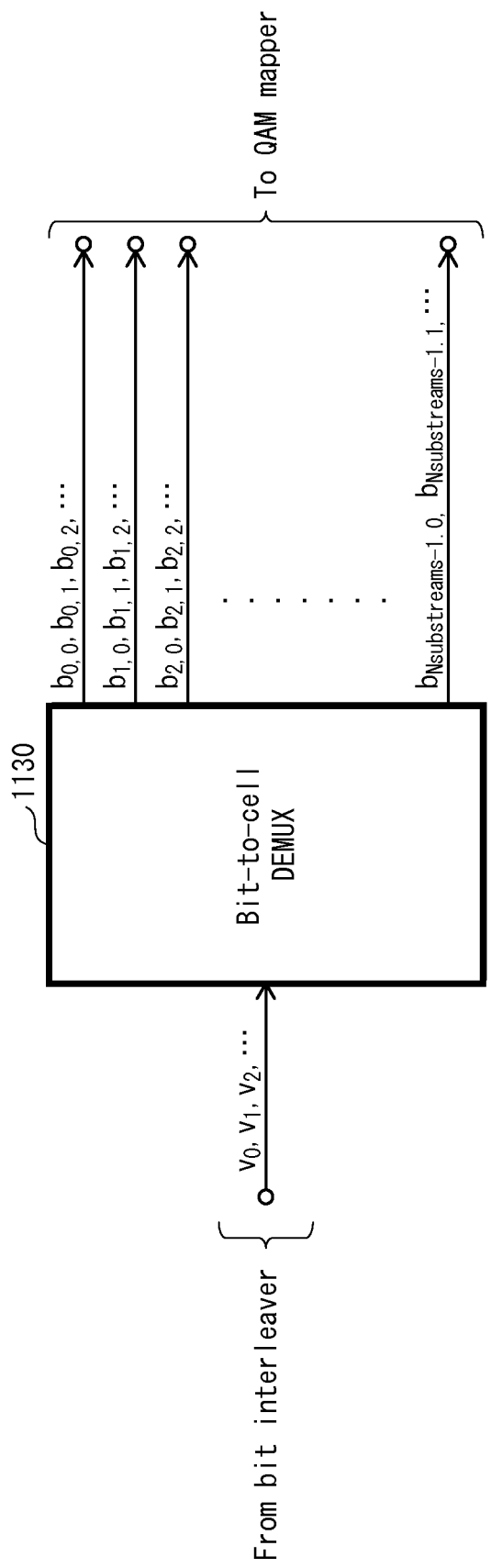
FIG. 7 illustrates the input and output of the bit-to-cell demultiplexer shown in FIG. 2.

FIG. 7 illustrates the input and output of the bit-to-cell demultiplexer 1130 shown in FIG. 2.

The bit stream from the bit interleaver 1120 is demultiplexed by the bit-to-cell demultiplexer 1130 into sub-bitstreams as shown in FIG. 7. The number of the sub-bitstreams $N_{substreams}$ is two for QPSK (4QAM) constellations and equal with the number of columns of the interleaver matrix in the column-row interleaver 1125 for higher-order constellations (16QAM, 64QAM, 256QAM). In the latter case the demultiplexing also contains a bit permutation step (which is conceptually equivalent to a permutation of the columns of the interleaver matrix in the column-row interleaver).

Figure 8:
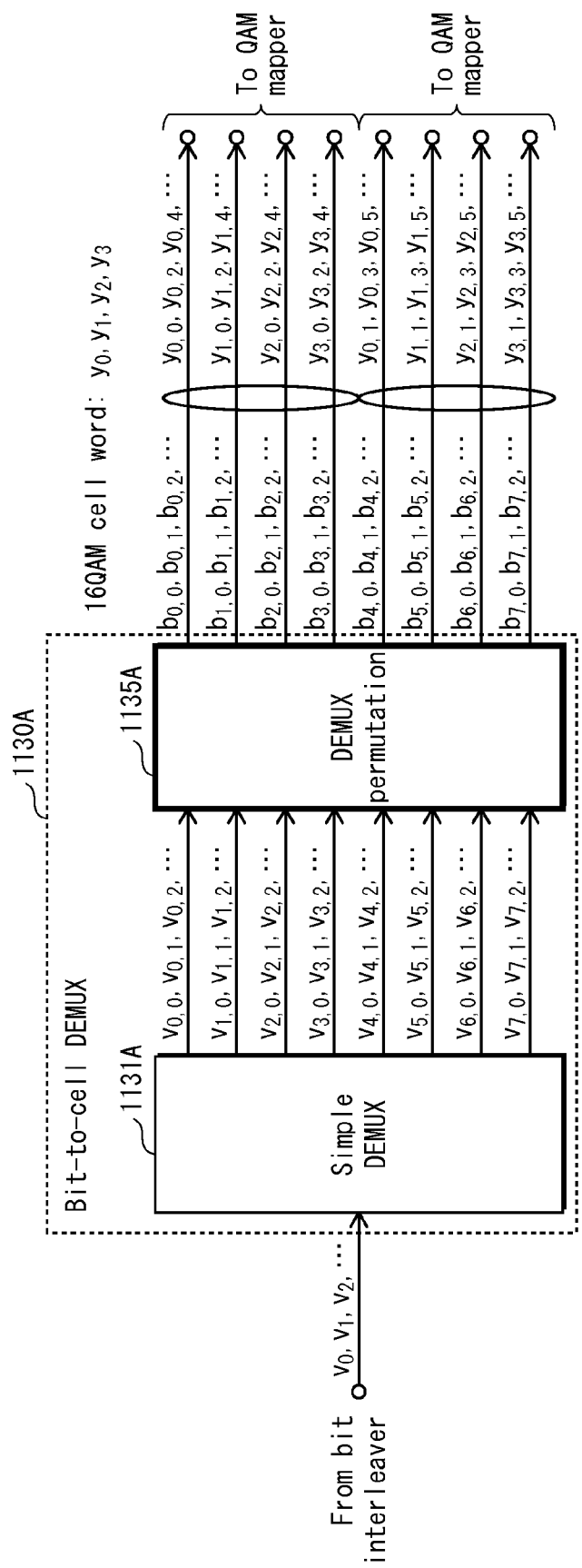
FIG. 8 is a block diagram of a bit-to-cell demultiplexer for 16QAM constellation.

FIG. 8 is a block diagram of the bit-to-cell demultiplexer for 16QAM constellation. Note that FIG. 8 specifically refers to the case for which the number of sub-bitstreams $N_{substreams}=8$, where each sub-bitstream has $16200/8=2025$ bits.

The bit-to-cell demultiplexer 1130A shown in FIG. 8 includes a simple demultiplexer 1131A and a DEMUX permutator 1135A.

The simple demultiplexer 1131A receives one bit stream ($v_0, v_1, v_2, \ldots$) from the bit interleaver 1120 and demultiplexes the received bit stream into 8 sub-bitstreams, namely the first sub-bitstream ($v_{0,0}, v_{0,1}, v_{0,2}, \ldots$) to the eighth sub-bitstream ($v_{7,0}, v_{7,1}, v_{7,2}, \ldots$). The simple demultiplexer 1131A then outputs the resulting 8 sub-bitstreams to the DEMUX permutator 1135A. Note that the output bits $v_{i,j}$ of the simple demultiplexer 1131A correspond to the input bits $v_{i+8 \times j}$ to the simple demultiplexer 1131A.

The DEMUX permutator 1135A receives the 8 sub-bitstreams from the simple demultiplexer 1131A, permutes the 8 sub-bitstreams received, and outputs 8 sub-bitstreams obtained as a result of the permutation. As shown in FIG. 8, the output bits $b_{0,i}$ to $b_{7,i}$ ($i=0, 1, 2, \ldots$) of the DEMUX permutator 1135A include two cell words ($y_{0,2 \times i}$ to $y_{3,2 \times i}$ and $y_{0,2 \times i+1}$ to $y_{3,2 \times i+1}$) and each cell word is forwarded to the QAM mapper 1140 for 16QAM.

Figure 9:
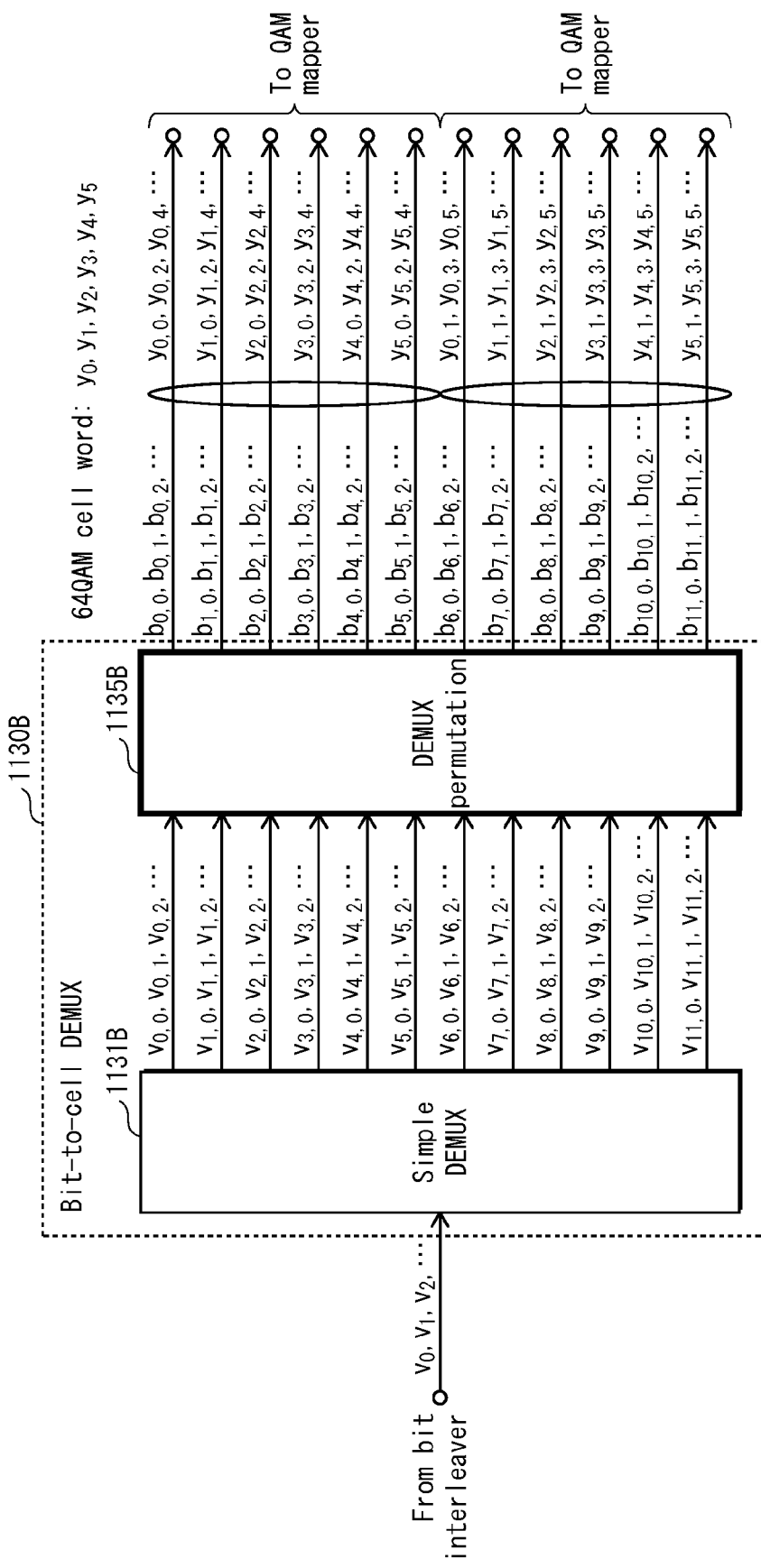
FIG. 9 is a block diagram of a bit-to-cell demultiplexer for 64QAM constellation.

FIG. 9 is a block diagram of the bit-to-cell demultiplexer for 64QAM constellation. Note that FIG. 9 specifically refers to the case where the number of sub-bitstreams $N_{substreams}=12$, where each sub-bitstream has $16200/12=1350$ bits.

The bit-to-cell demultiplexer 1130B shown in FIG. 9 includes a simple demultiplexer 1131B and a DEMUX permutator 1135B.

The simple demultiplexer 1131B receives one bit stream ($v_0, v_1, v_2, \ldots$) from the bit interleaver 1120 and demultiplexes the received bit stream into 12 sub-bitstreams, namely the first sub-bitstream ($v_{0,0}, v_{0,1}, v_{0,2}, \ldots$) to the twelfth sub-bitstream ($v_{11,0}, v_{11,1}, v_{11,2}, \ldots$). The simple demultiplexer 1131B then outputs the resulting 12 sub-bitstreams to the DEMUX permutator 1135B. Note that the output bits $v_{i,j}$ of the simple demultiplexer 1131B correspond to the input bits $v_{i+12 \times j}$ to the simple demultiplexer 1131B.

The DEMUX permutator 1135B receives the 12 sub-bitstreams from the simple demultiplexer 1131B, permutes the 12 sub-bitstreams received, and outputs 12 sub-bitstreams obtained as a result of the permutation. As shown in FIG. 9, the output bits $b_{0,i}$ to $b_{11,i}$ ($i=0, 1, 2, \ldots$) of the DEMUX permutator 1135B include two cell words ($y_{0,2 \times i}$ to $y_{5,2 \times i}$ and $y_{0,2 \times i+1}$ to $y_{5,2 \times i+1}$) and each cell word is forwarded to the QAM mapper 1140 for 64QAM.

Figure 10:
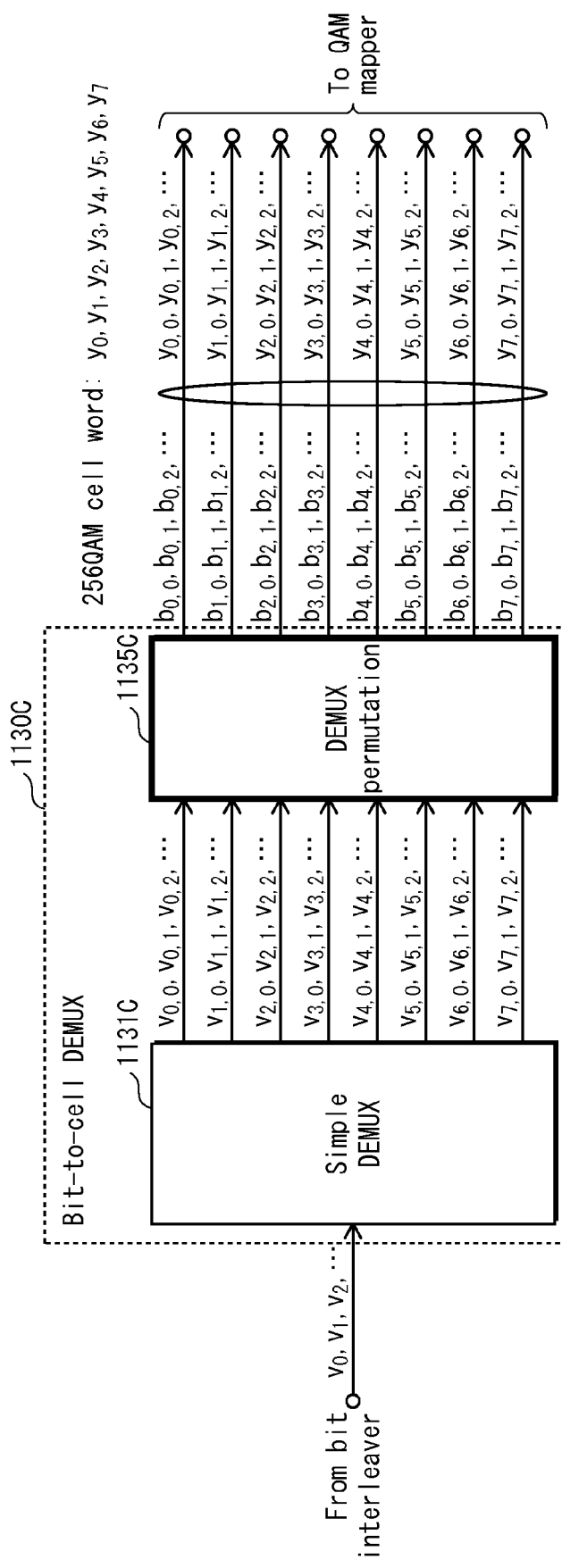
FIG. 10 is a block diagram of a bit-to-cell demultiplexer for 256QAM constellation.
Figure 11:
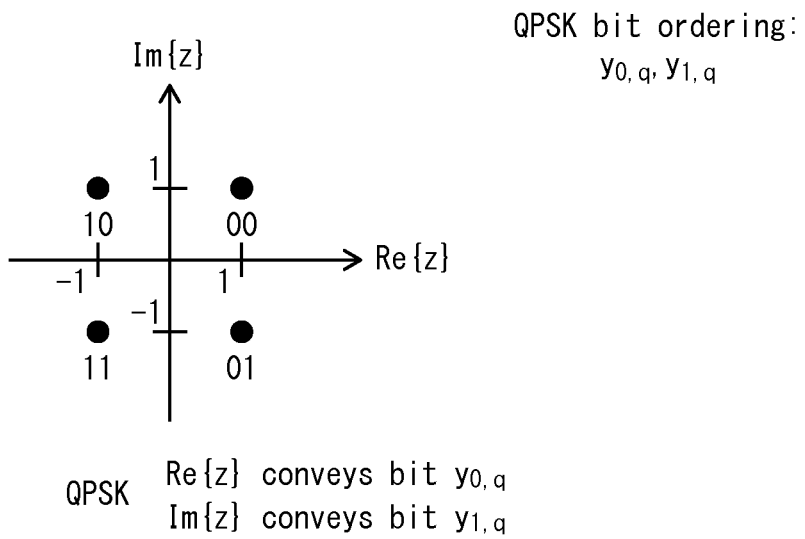
FIG. 11 shows a particular constellation mapping for QPSK applicable in DVB-T2 for transmission and reception of data.
Figure 12:
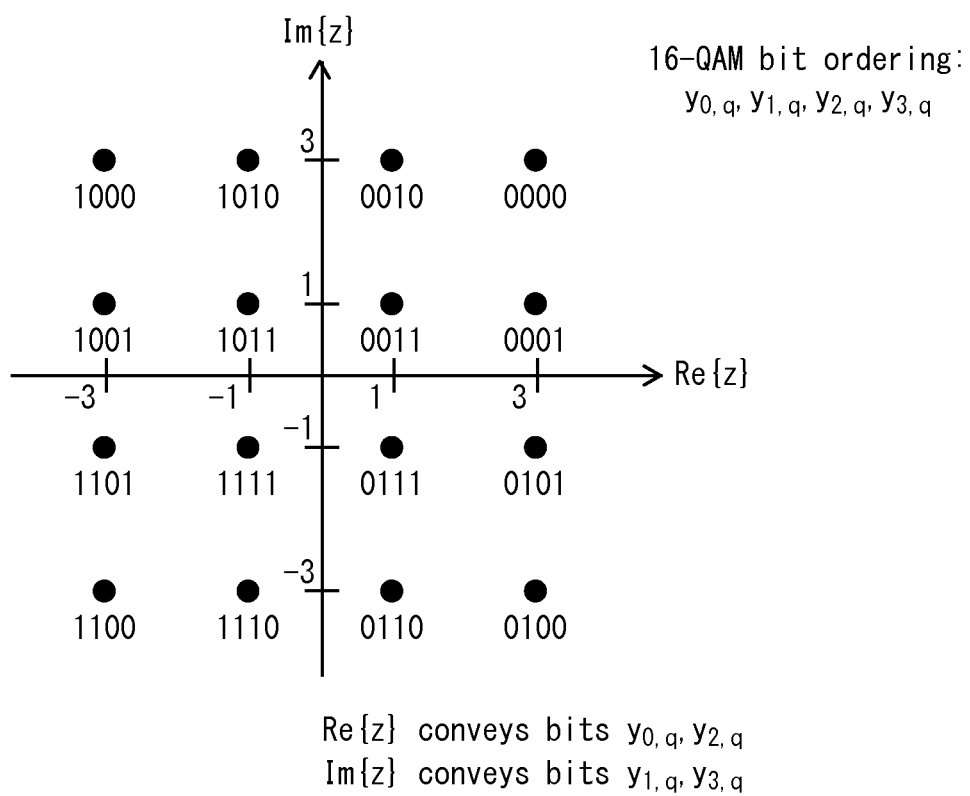
FIG. 12 shows a particular constellation mapping for 16QAM applicable in DVB-T2 for transmission and reception of data.
Figure 13:
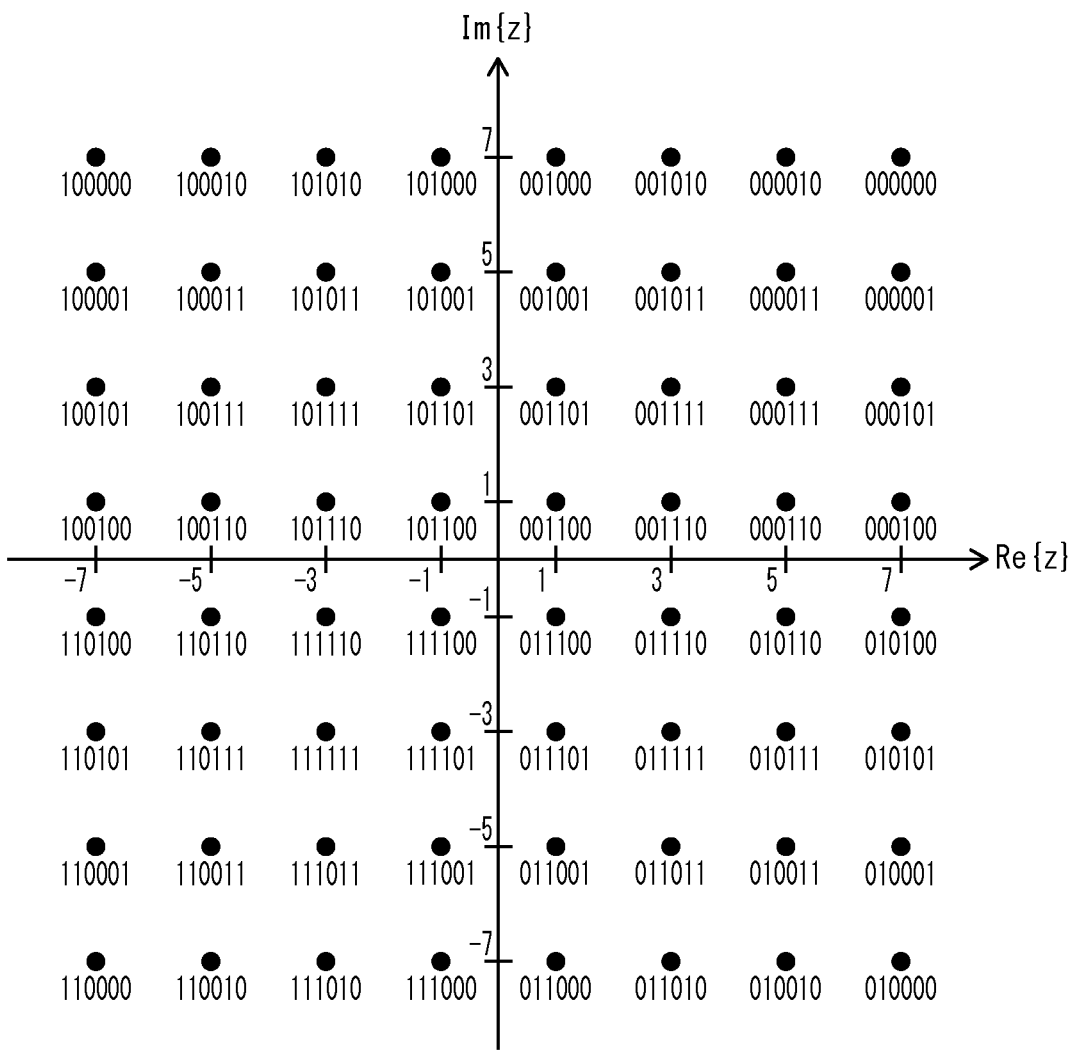
FIG. 13 shows a particular constellation mapping for 64QAM applicable in DVB-T2 for transmission and reception of data.
Figure 14:
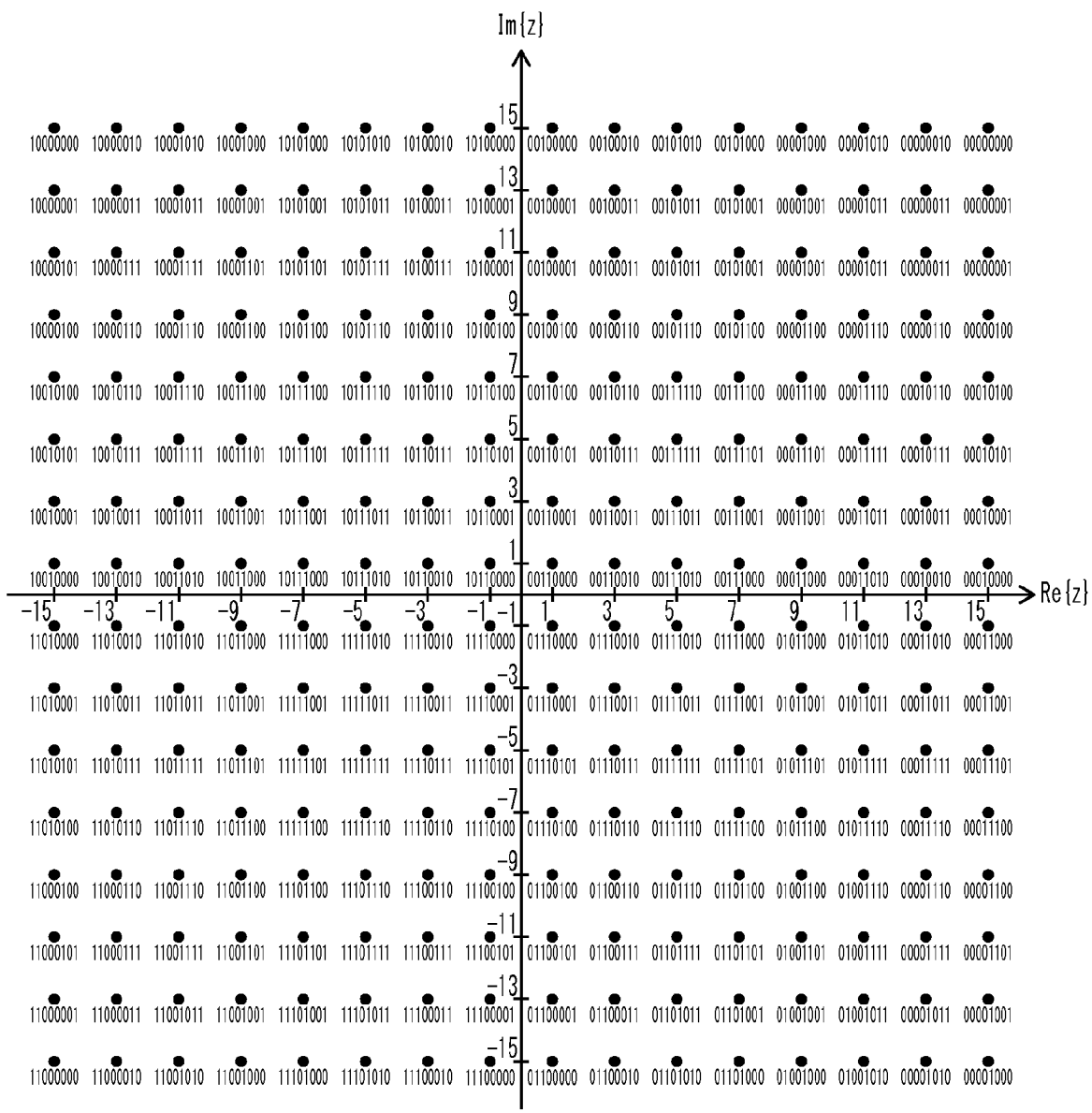
FIG. 14 shows a particular constellation mapping for 256QAM applicable in DVB-T2 for transmission and reception of data.

FIG. 10 is a block diagram of the bit-to-cell demultiplexer for 256QAM constellation. Note that FIG. 10 specifically refers to the case where the number of sub-bitstreams $N_{substreams}=8$, where each sub-bitstream has $16200/8=2025$ bits.

The bit-to-cell demultiplexer 1130C shown in FIG. 10 includes a simple demultiplexer 1131C and a DEMUX permutator 1135C.

The simple demultiplexer 1131C receives one bit stream ($v_0, v_1, v_2, \ldots$) from the bit interleaver 1120 and demultiplexes the received bit stream into 8 sub-bitstreams, namely the first sub-bitstream ($v_{0,0}, v_{0,1}, v_{0,2}, \ldots$) to the eighth sub-bitstream ($v_{7,0}, v_{7,1}, v_{7,2}, \ldots$). The simple demultiplexer 1131C then outputs the resulting 8 sub-bitstreams to the DEMUX permutator 1135C. Note that the output bits $v_{i,j}$ of the simple demultiplexer 1131C correspond to the input bits $v_{i+8 \times j}$ to the simple demultiplexer 1131C.

The DEMUX permutator 1135C receives the 8 sub-bitstreams from the simple demultiplexer 1131C, permutes the 8 sub-bitstreams received, and outputs 8 sub-bitstreams obtained as a result of the permutation. As shown in FIG. 10, the output bits $b_{0,i}$ to $b_{7,i}$ ($i=0, 1, 2, \ldots$) of the DEMUX permutator 1135C includes one cell word ($y_{0,i}$ to $y_{7,i}$) and the cell word is forwarded to the QAM mapper 1140 for 256QAM.

The bit-to-cell demultiplexing by the bit-to-cell demultiplexer 1130 is defined as a mapping of the bit-interleaved input bits $b_{di}$ onto the output bits $b_{e,do}$, where:

do is di div $N_{substreams}$;

div is a function that returns an integer portion of the result obtained by dividing di by $N_{substreams}$;

e is the demultiplexed sub-bitstream (sub-bitstream output from the bit-to-cell demultiplexer 1130) number ($0 \leq e < N_{substreams}$);

$v_{di}$ is the input to the bit-to-cell demultiplexer 1130;

di is the input bit number;

$b_{e,do}$ is the output from the bit-to-cell demultiplexer 1130; and do is the bit number of a given sub-bitstream output from the bit-to-cell demultiplexer 1130.

Correspondingly, if the example configuration of FIG. 4 is assumed, with the codeword length of 16200 bits and 16QAM constellation, 8 sub-bitstreams would be formed ($N_{substreams}=8$) according to Table 1 above. Each sub-bitstream has $16200/8=2025$ bits (do=di div $N_{substreams}$) and constitutes one column of the interleaver matrix.

The DVB-T2 standard defines bit-to-cell demultiplexing processes for all the available LDPC code rates in DVB-T2 (1/2, 3/5, 2/3, 3/4, 4/5, and 5/6), and constellation modes (QPSK, 16QAM, 64QAM and 256 QAM) (see Tables 13(a, b, c) in Clause 6.2.1 of Non-Patent Literature 1: EN 302.755 v1.2.1). These parameters shown in Tables 13(a, b, c) define permutations of the input bits to the output bits of a sub-bitstream.

For instance, for LDPC codewords of codeword length 16200 bits and the QAM constellation is a 16QAM constellation, an input bit $v_{di}$ is permuted to an output bit $b_e$ according to the following permutation rule (see Table 13(a) in Clause 6.2.1 of Non-Patent Literature 1: EN 302.755 v1.2.1).

That is, the permutation rule is $v_0=b_7$, $v_1=b_1$, $v_2=b_4$, $v_3=b_2$, $v_4=b_5$, $v_5=b_3$, $v_6=b_6$, $v_7=b_0$.

This permutation rule is optimized for code rates 1/2, 3/4, 4/5, and 5/6, such that the error rate at the output of the LDPC decoder in the receiver is minimized.

Except for QPSK (LDPC codeword length $N_{ldpc}$=64800 or 16200) and 256QAM ($N_{ldpc}$=16200 only), the words of width $N_{substreams}$ are split into two cell words of width $\eta_{MOD}=N_{substreams}/2$ at the output of the bit-to-cell demultiplexer. The first $\eta_{MOD}=N_{substreams}/2$ bits $[b_{0,do} \ldots b_{Nsubstreams/2-1,do}]$ form the first of a pair of output cell words $[y_{0,2do} \ldots y_{\eta \bmod -1, 2do}]$ and the remaining output bits $[b_{Nsubstreams/2, do} \ldots b_{Nsubstreams-1,do}]$ form the second output cell word $[y_{0,2do+1} \ldots y_{\eta \bmod -1,2do+1}]$ fed to the QAM mapper.

In the case of QPSK (LDPC LDPC codeword length $N_{ldpc}$=64800 or 16200) and 256QAM ($N_{ldpc}$=16200 only), the words of width $N_{substreams}$ from the bit-to-cell demultiplexer form the output cell words and are fed directly to the QAM mapper (so: $[y_{0,do} \ldots y\eta_{mod-1,do}]=[b_{0,do} \ldots b_{Nsubstreams-1,do}]$).

In particular, the number of cell words involved in a DEMUX permutation by the DEMUX permutator is either one (for 256QAM) or two (for 16QAM and 64QAM).

Put differently, the DEMUX permutation is conceptually equivalent to a permutation of the columns in the interleaver matrix of the column-row interleaver of the bit-interleaver.

Subsequently, each cell word output from the bit-to-cell demultiplexer is modulated according to a particular mapping constellation (such as QPSK, 16QAM, 64QAM or 256QAM). The constellations and the details of the Gray mapping applied to the bits according to DVB-T2 are illustrated in FIGS. 11, 12, 13 and 14.

A next-generation digital broadcast standard for handheld reception is currently under development in the DVB standardization body under the name DVB-NGH. This DVB-NGH standard will use the same BICM structure as explained above, which comprises FEC encoding, bit-interleaving, demultiplexing, and QAM constellation mapping. In addition to some of the DVB-T2 LDPC code rates, two additional LDPC code rates (namely 7/15 and 8/15) are added. The same QAM constellations as DVB-T2 will remain, i.e. QPSK (4QAM) constellation, 16QAM constellation, 64QAM constellation, and 256QAM constellation.

Only short 16K LDPC codewords, i.e. with 16200 bits, will be used in DVB-NGH. In DVB-NGH LDPC codes have been proposed to be used for the newly introduced code rates of 7/15 and 8/15. The particular LDPC codes probably to be used for the code rates of 7/15 and 8/15 are depicted respectively in FIGS. 25 and 26, and the contents of Non-Patent Literature 2 are also helpful.

The description of the codes in FIGS. 25 and 26 is identical to that used in the DVB-S2 standard, more exactly in Clause 5.3.2 and Annexes B and C of Non-Patent Literature 3 (ETSI EN 302 307, V1.2.1, published on April 2009). FIG. 25 shows the addresses of the parity bit accumulators for the LDPC code having a codeword length of 16200 bits with the code rate of 7/15. FIG. 26 shows the addresses of the parity bit accumulators for the LDPC code having a codeword length of 16200 bits with the code rate of 8/15. The parallel or cyclic factor has the same value 360 like in DVB-S2.

Since the disclosure of FIGS. 25 and 26 comply with the contents of Non-Patent Literature 3, it is naturally assumed that the LDPC codes are readily understandable to those skilled in the art based on FIGS. 25 and 26. Yet, the following describes an example in which the contents of Non-Patent Literature 3 (Clause 5.3.2 and Annexes B and C of ETSI EN 302 307 V1.2.1 (2009, April)) are applied.

The LDPC encoder systematically encodes an information block (output of the BCH encoder) i of size $K_{ldpc}$ into an LDPC codeword c of size of $N_{ldpc}$, as in Equation 1 below.

Let $i=(i_0, i_1, \ldots, i_{K_{ldpc}-1})$, $$c=(c_0, c_1, c_2, \ldots c_{N_{ldpc}-1})=(i_0, i_1, \ldots, i_{K_{ldpc}-1}, p_0, p_1, \ldots, p_{N_{ldpc}-K_{ldpc}-1})$$ [Equation 1]

where $i_0, i_1, \ldots, i_{K_{ldpc}-1}$: information bits
$p_0, p_1, \ldots, p_{N_{ldpc}-K_{ldpc}-i}$ parity bits Note that the parameters ($N_{ldpc}$ and $K_{ldpc}$) for LDPC code with code rate 7/15 are (16200 and 7560).

The task of the LDPC encoder is to compute the $N_{ldpc}-K_{ldpc}$ parity bits for every block of $K_{ldpc}$ information bits.

First, the parity bits are initialized as shown in Equation 2.

$$p_0=p_1=\ldots=p_{N_{ldpc}-K_{ldpc}-1}=0$$ [Equation 2]

The first information bit $i_0$ is accumulated at each parity bit address specified in the first row of FIG. 25. More specifically, the operations of Equation 3 are performed.

$$p_3=p_3 \oplus i_0 \; p_{6535}=p_{6535} \oplus i_0$$

$$p_{137}=p_{137} \oplus i_0 \; p_{6560}=p_{6560} \oplus i_0$$

$$p_{314}=p_{314} \oplus i_0 \; p_{7146}=p_{7146} \oplus i_0$$

$$p_{327}=p_{327} \oplus i_0 \; p_{7180}=p_{7180} \oplus i_0$$

$$p_{983}=p_{983} \oplus i_0 \; p_{7408}=p_{7408} \oplus i_0$$

$$p_{1597}=p_{1597} \oplus i_0 \; p_{7790}=p_{7790} \oplus i_0$$

$$p_{2028}=p_{2028} \oplus i_0 \; p_{7893}=p_{7893} \oplus i_0$$

$$p_{3043}=p_{3043} \oplus i_0 \; p_{8123}=p_{8123} \oplus i_0$$

$$p_{3217}=p_{3217} \oplus i_0 \; p_{8313}=p_{8313} \oplus i_0$$

$$p_{4109}=p_{4109} \oplus i_0 \; p_{8526}=p_{8526} \oplus i_0$$

$$p_{6020}=p_{6020} \oplus i_0 \; p_{8616}=p_{8616} \oplus i_0$$

$$p_{6178}=p_{6178} \oplus i_0 \; p_{8638}=p_{8638} \oplus i_0$$ [Equation 3]

where, the symbol $\oplus$ stands for XOR.

For the next 359 information bits $i_m$ (m=1, 2, \ldots 359), $i_m$ is accumulated at each parity bit address {x+(m mod 360)×q} mod $N_{ldpc}-K_{ldpc}$). Note that x denotes the address of the parity bit accumulator corresponding to the first bit $i_0$, and q is a constant dependent on the code rate 7/15, which in this case is 24. The value of q is given by q=($N_{ldpc}-K_{ldpc}$)/360.

For the 361$^{st}$ information bit $i_{360}$, the addresses of the parity bit accumulators are given in the second row of FIG. 25. In a similar manner, for the next 360 information bits $i_m$ (m=361, 362, \ldots 719), the addresses of the parity bit accumulators are given by {x+(m mod 360)×q} mod($N_{ldpc}-K_{ldpc}$). Note that x denotes the address of the parity bit accumulator for the 360$^{th}$ information bit $i_{360}$, i.e. the entries in the second row of FIG. 25.

In a similar manner, for every group of 360 new information bits, a new row from FIG. 25 is used to find the addresses of the parity bit accumulators.

After all of the information bits are exhausted, the final parity bits are obtained as follows.

Sequentially perform the operations of Equation 4 starting with i=1.

$$p_i = p_i \oplus p_{i-1}, i=1, 2, \ldots, N_{ldpc}-K_{ldpc}-1 \quad \text{[Equation 4]}$$

where, the symbol ⊕ stands for XOR.

Final content of $p_i$ (i=0, 1, ... $N_{ldpc}-K_{ldpc}-1$) is equal to the parity bit $p_i$.

Note that the same description as given above in the example directed to FIG. 25 is applicable to FIG. 26, by simply replacing the values of the entries in each row of FIG. 25 with those of FIG. 26. Yet, the parameters ($N_{ldpc}$ and $K_{ldpc}$) for LDPC code are (16200 and 8640) and that q=21.

Although the above description of LDPC codes complies with the notation of DVB-S2, according to the notation of DVB-T2 or DVB-NGH, q mentioned above is written as $Q_{ldpc}$, for example.

In the DVB-NGH standard, currently no permutations by bit-to-cell demultiplexer are defined for the code rates 7/15 and 8/15 for respective 16QAM constellation, 64QAM constellation, and 256QAM constellation. As in DVB-T2, QPSK (4QAM) constellation does not need such a permutation by the bit-to-cell demultiplexer. It is because the two bits encoded in a QPSK constellation have the same robustness level.

In order to maximize the performance of the new LDPC codes of rate 7/15 and 8/15 in conjunction with various QAM constellation sizes and under various reception conditions, new optimized permutation rules are required for the bit-to-cell demultiplexing.

Embodiments of Invention

In the following, several embodiments of the invention will be explained in detail, with reference to the drawings. The explanations should not be understood as limiting the invention, but as a mere example of the general principles of the present invention. A skilled person should be aware that the general principles of the embodiments as laid out in the "Supplement 2" section of this specification can be applied to different scenarios and in ways that are not explicitly described herein.

Most of the embodiments of the present invention explained in the following refer to the DVB-NGH system. The new DVB-NGH standard will update and replace the DVB-H standard for digital broadcasting to mobile devices.

Though not yet finally decided, it is assumed that the DVB-NGH system adopts a structure similar to the one of DVB-T2 subsystem, as explained above in the "Findings by Present Inventor Leading to the Invention" section of this specification. This however should not restrict the scope of protection. Actually, the embodiments of the present invention can be applied to any system having the structural features as explained in the "Supplement 2" section of this specification.

Various embodiments of the present invention provide a system for processing bit signals to be transmitted before they are input to a QAM mapper. Further embodiments of the present invention provides a system for processing bit signals received from the QAM demapper (for performing the inverse process of the process conducted on the transmission bits at the transmitting side).

It is assumed that a digital signal, comprising e.g. an audio and/or video signal, is to be transmitted/broadcast from transmitters and is intended to be received by receivers, such as mobile terminals.

<Transmitting Side>

The following describes a BICM encoder according to an embodiment of the present invention, with reference to the drawings. Note that the BICM encoder is provided in a transmitter.

Figure 15:
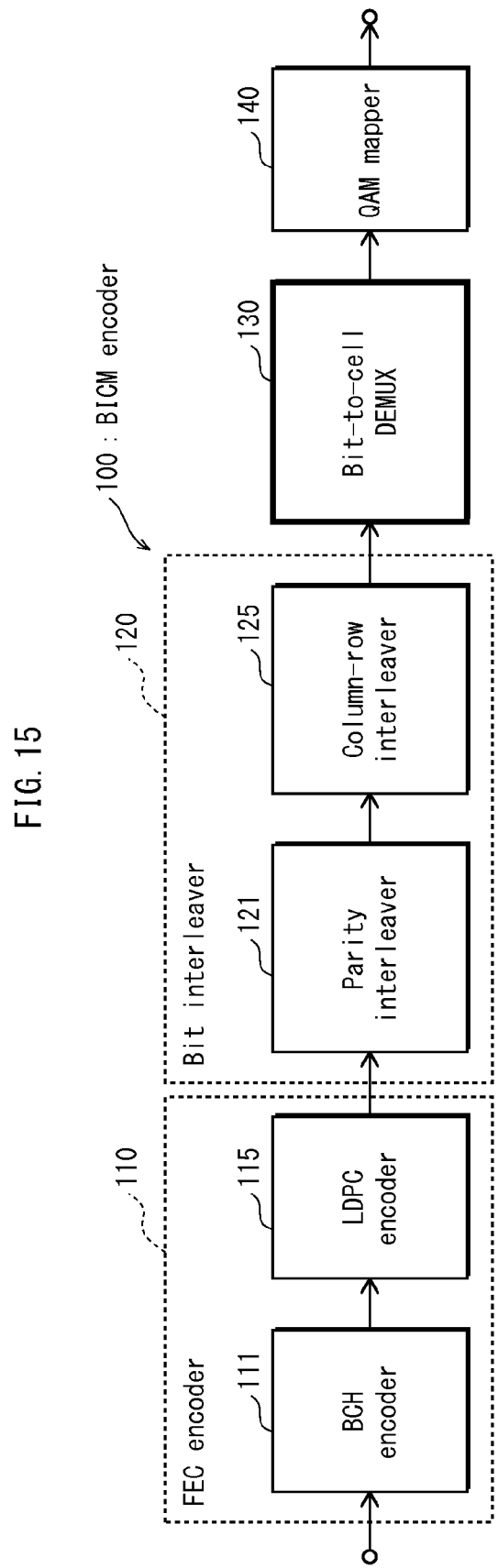
FIG. 15 is a block diagram of a BICM encoder according to an embodiment of the present invention.

FIG. 15 is a block diagram of the BICM encoder according to the embodiment of the present invention. The BICM encoder shown in FIG. 15 basically corresponds to the BICM encoder according to DVB-T2 and described in detail in the "Findings by Present Inventor Leading to the Invention" section with reference to FIGS. 1 through 14.

The BICM encoder 100 shown in FIG. 15 includes an FEC encoder 110, a bit interleaver 120, a bit-to-cell demultiplexer 130, and a QAM mapper 140.

The FEC encoder 110 includes a BCH encoder 111 and an LDPC encoder 115. The contents described in the "Supplement 2" section is also applicable to a system in which the BCH encoder 111 upstream of the LDPC encoder 115 is omitted or replaced with an encoder for different code.

To the BCH encoder 111, a digital signal (baseband signal), such as an audio and/or a video signal, consisting of information bits is input. The BCH encoder 111 generates BCH parity bits by BCH encoding a baseband frame input thereto and outputs a BCH codeword to which the BCH parity bits are appended to the LDPC encoder 115.

The LDPC encoder 115 encodes the BCH codeword with a specific LDPC code to generate LDPC parity bits. Note that the LDPC code used here in this embodiment is an LDPC code having a codeword length of 16200 bits with code rate 7/15 according to FIG. 25 or an LDPC code having a codeword length of 16200 bits with code rate 8/15 according to FIG. 26.

The LDPC encoder 115 outputs to the bit interleaver 120 an LDPC codeword of $N_{ldpc}$=16200 bits to which the LDPC parity bits obtained as a result of the LDPC encoding are appended (i.e., a bitstream of data packets consisting of $N_{ldpc}$=16200 bits). It should be noted that the output of a bitstream of data packets consisting of $N_{ldpc}$=64800 bits from the LDPC encoder 115 is not foreseen for transmission/reception of signals for handheld devices according to DVB-NGH standard. The encoded 16200-bit LDPC codewords are input to the bit interleaver 120 that performs parity interleaving and column twist interleaving as explained in the DVB-T2 standard, Clause 6.1.3, incorporated herein by reference.

The bit interleaver 120 includes a parity interleaver 121 and a column-row interleaver 125.

The parity interleaver 121 performs parity interleaving to permute the order of parity bits of the 16200-bit LDPC codeword and outputs the resulting LDPC codeword to the column-row interleaver 125.

More specifically, let λ denote the input to the parity interleaver 121 and u denote the output from the parity interleaver 121, the parity interleaver 121 performs the operations of Equation 5.

$$u_i = \lambda_i : 0 \leq i < K_{ldpc}$$

$$u_{K_{ldpc}+360t+s} = \lambda_{K_{ldpc}+Q_{ldpc}s+t} : 0 \leq s < 360, 0 \leq t < Q_{ldpc} \quad \text{[Equation 5]}$$

In Equation 5, $K_{ldpc}$, denotes the number of information bits of an LDPC codeword and information bits are not interleaved. The cyclic factor of the parity-check matrix is 360. Note that $Q_{ldpc}$=24 for code rate 7/15, whereas $Q_{ldpc}$=21 for code rate 8/15.

The column-row interleaver 125 performs column twist interleaving (column-row interleaving with twist) on the parity interleaved 16200-bit LDPC codeword received from the parity interleaver 121 and outputs the 16200-bit LDPC codeword resulting from the column twist interleaving to the bit-to-cell demultiplexer 130.

The interleaver matrix used by the column-row interleaver 125 for column twist interleaving is a matrix whose number of entries (a value obtained by multiplying the number of columns by the number of rows) is 16200, which is equal to the number of LDPC codeword bits. That is, the dimensions of the interleaver matrix differ (i.e., the number of columns as well as the number of rows differ) depending on the type of modulation being used in the QAM mapper 140. As previously explained, for 16QAM and $N_{ldpc}$=16200, the number of rows $N_r$=2025 and the number of columns $N_c$=8. For 64QAM and $N_{ldpc}$=16200, the number of rows $N_r$=1350 and the number of columns $N_c$=12. For 256QAM and $N_{ldpc}$=16200, the number of rows $N_r$=2025 and the number of columns $N_c$=8.

Considering column twist and the number of columns, 8 or 12, the column-row interleaver 125 serially writes column-wise the 16200 data bits (parity interleaved LDPC codeword), which is output from the parity interleaver 121, with twist. In the process of twisting, the write start position of each column is twisted by using the column twisting parameters $t_c$ shown in Table 2. Subsequently, the column-row interleaver 125 serially reads out the 16200 bits from the interleaver matrix row-wise (see FIGS. 4, 5, and 6 for reference).

It should be noted, however, that the embodiments of the present invention, in particular the various permutation rules used by the bit-to-cell demultiplexer, can be applied to column twisting parameters not listed in Table 2. Furthermore, though column twist interleaving is part of the DVB-T2 system, and thus will probably be part of the DVB-NGH system, the embodiments of the present invention can also be applied to a column-row interleaving process without column twist.

After the column twist interleaving process by the column-row interleaver 125, the bit-to-cell demultiplexer 130 permutes the 16200-bit LDPC codewords according to the various examples of the embodiment of the present invention. The permutation processing, and in particular the permutation rules which are to be applied, depend on: (1) the LDPC code used by the LDPC encoder 115, further characterized by its codeword length and the code rate; and on (2) the QAM constellation size used by the QAM mapper 140.

As explained before, the bit-to-cell demultiplexer 130 demultiplexes the bits of the bit-interleaved LDPC codeword, which is input from the bit interleaver 120, into parallel cell words. Then, the bit-to-cell demultiplexer 130 performs the permutation after which the permuted cell words are mapped into constellation symbols according to the specified QAM mapping. The number of output QAM data cells (the number of cell words) and the effective number of bits per cell word $\eta_{MOD}$ is the same as for DVB-T2 explained in the "Findings by Present Inventor Leading to the Invention" section of this specification. Particularly, there are 8100 cells for QPSK (4QAM), 4050 cells for 16QAM, 2700 cells for 64QAM, and 2025 cells for 256 QAM.

The following now describes the bit-to-cell demultiplexer 130 shown in FIG. 15, with reference to FIGS. 16 through 19.

Figure 16:
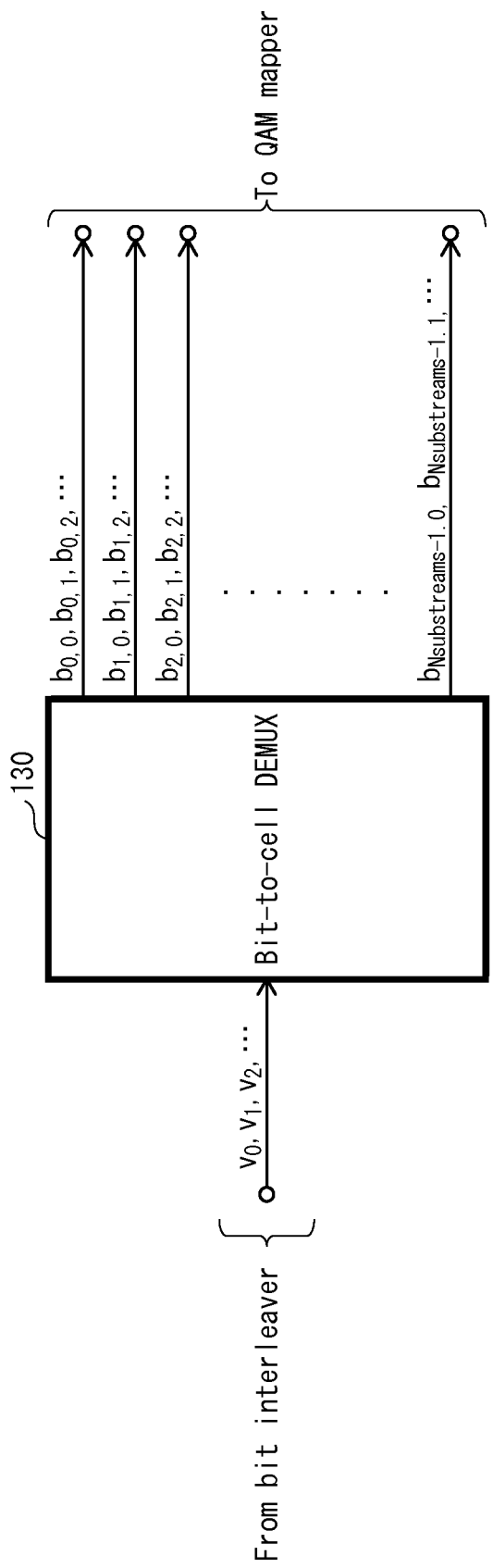
FIG. 16 illustrates the input and output of the bit-to-cell demultiplexer shown in FIG. 15.

FIG. 16 illustrates the input and output of the bit-to-cell demultiplexer 130 shown in FIG. 15.

The bitstream from the bit interleaver 120 is demultiplexed by the bit-to-cell demultiplexer 130 into sub-bitstreams as shown in FIG. 16. The number of sub-bitstreams $N_{substreams}$ is the same as for DVB-T2. In particular, the number of sub-bitstreams $N_{substreams}$ is 2 for QPSK (4QAM) constellations, 8 for 16QAM constellation, 12 for 64QAM constellation, and 8 for 256QAM constellation.

After the bit-to-cell demultiplexing, a permutation is carried out by a particular interleaving of input bits $b_{di}$ onto the output bits $b_{e,do}$. Note that do=di div $N_{substreams}$, and div is a function that returns an integer portion of the result obtained by dividing di by $N_{substreams}$. Further, e is the demultiplexed bitstream number ($0 \le e < N_{substreams}$) (i.e., the number identifying the sub-bitstream output from the bit-to-cell demultiplexer 130). Still further, $v_{di}$ is the input bits to the bit-to-cell demultiplexer 130, and di is the input bit number. Still further, $b_{e,do}$ is the output bits from the bit-to-cell demultiplexer 130, and do is the bit number of a given sub-bitstream output from the bit-to-cell demultiplexer 130.

Figure 17:
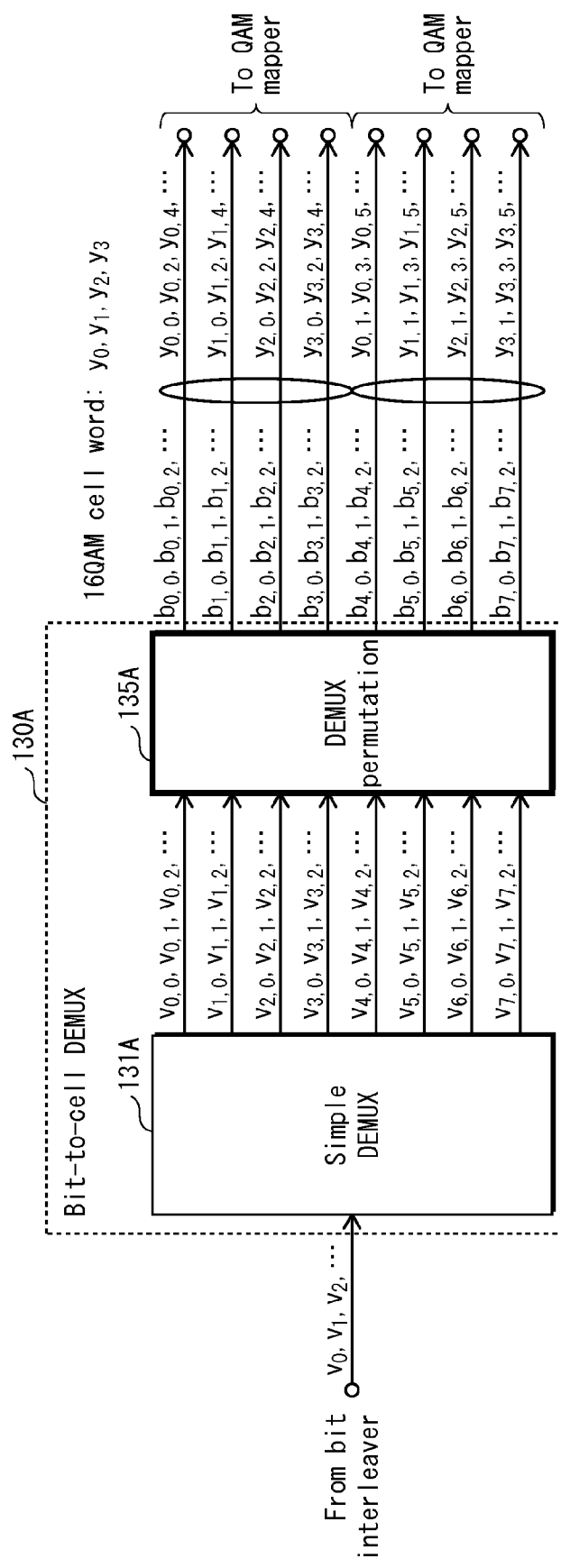
FIG. 17 is a block diagram of a bit-to-cell demultiplexer for 16QAM constellation.

FIG. 17 is a block diagram of the bit-to-cell demultiplexer for 16QAM constellation. Note that FIG. 17 specifically refers to the case where the number of sub-bitstreams $N_{substreams}$=8, where each sub-bitstream has 16200/8=2025 bits.

The bit-to-cell demultiplexer 130A shown in FIG. 17 includes a simple demultiplexer 131A and a DEMUX permutator 135A.

The simple demultiplexer 131A receives one bit stream ($v_0, v_1, v_2, \ldots$) from the bit interleaver 120 and demultiplexes the received bit stream into 8 sub-bitstreams, namely the first sub-bitstream ($v_{0,0}, v_{0,1}, v_{0,2}, \ldots$) to the eighth sub-bitstream ($v_{7,0}, v_{7,1}, v_{7,2}, \ldots$). The simple demultiplexer 131A then outputs the resulting 8 sub-bitstreams to the DEMUX permutator 135A. Note that the output bits $v_{i,j}$ of the simple demultiplexer 131A correspond to the input bits $v_{i+8 \times j}$ to the simple demultiplexer 131A.

The DEMUX permutator 135A receives the 8 sub-bitstreams from the simple demultiplexer 131A, permutes the 8 sub-bitstreams received, and outputs 8 sub-bitstreams obtained as a result of the permutation. As shown in FIG. 17, the output bits $b_{0,i}$ to $b_{7,i}$ (i=0, 1, 2, . . . ) of the DEMUX permutator 135A include two cell words ($y_{0,2 \times i}$ to $y_{3,2 \times i}$ and $y_{0,2 \times i+1}$ to $y_{3,2 \times i+1}$), and each cell word is forwarded to the QAM mapper 140 for 16QAM.

Figure 18:
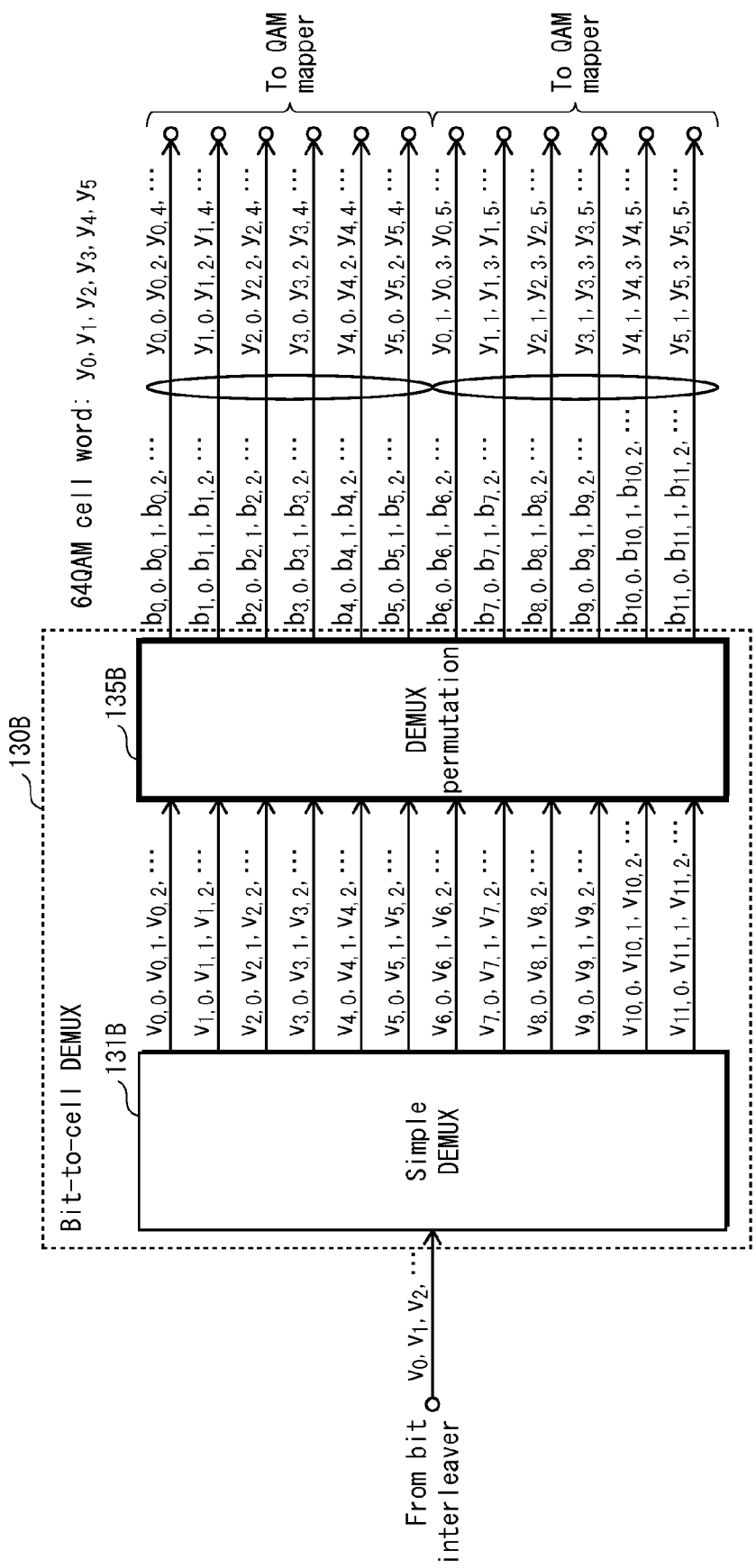
FIG. 18 is a block diagram of a bit-to-cell demultiplexer for 64QAM constellation.

FIG. 18 is a block diagram of the bit-to-cell demultiplexer for 64QAM constellation. Note that FIG. 18 specifically refers to the case for which the number of sub-bitstreams $N_{substreams}$=12, where each sub-bitstream has 16200/12=1350 bits.

The bit-to-cell demultiplexer 130B shown in FIG. 18 includes a simple demultiplexer 131B and a DEMUX permutator 135B.

The simple demultiplexer 131B receives one bit stream ($v_0, v_1, v_2, \ldots$) from the bit interleaver 120 and demultiplexes the received bit stream into 12 sub-bitstreams, namely the first sub-bitstream ($v_{0,0}, v_{0,1}, v_{0,2}, \ldots$) to the twelfth sub-bitstream ($v_{11,0}, v_{11,1}, v_{11,2}, \ldots$). The simple demultiplexer 131B then outputs the resulting 12 sub-bitstreams to the DEMUX permutator 135B. Note that the output bits $v_{i,j}$ of the simple demultiplexer 131B correspond to the input bits $v_{i+12 \times j}$ to the simple demultiplexer 131B.

The DEMUX permutator 135B receives the 12 sub-bitstreams from the simple demultiplexer 131B, permutes the 12 sub-bitstreams received, and outputs 12 sub-bitstreams obtained as a result of the permutation. As shown in FIG. 18, the output bits $b_{0,i}$ to $b_{11,i}$ (i=0, 1, 2, . . . ) of the DEMUX permutator 135B include two cell words ($y_{0,2 \times i}$ to $y_{5,2 \times i}$ and $y_{0,2 \times i+1}$ to $y_{5,2 \times i+1}$) and each cell word is forwarded to the QAM mapper 140 for 64QAM.

Figure 19:
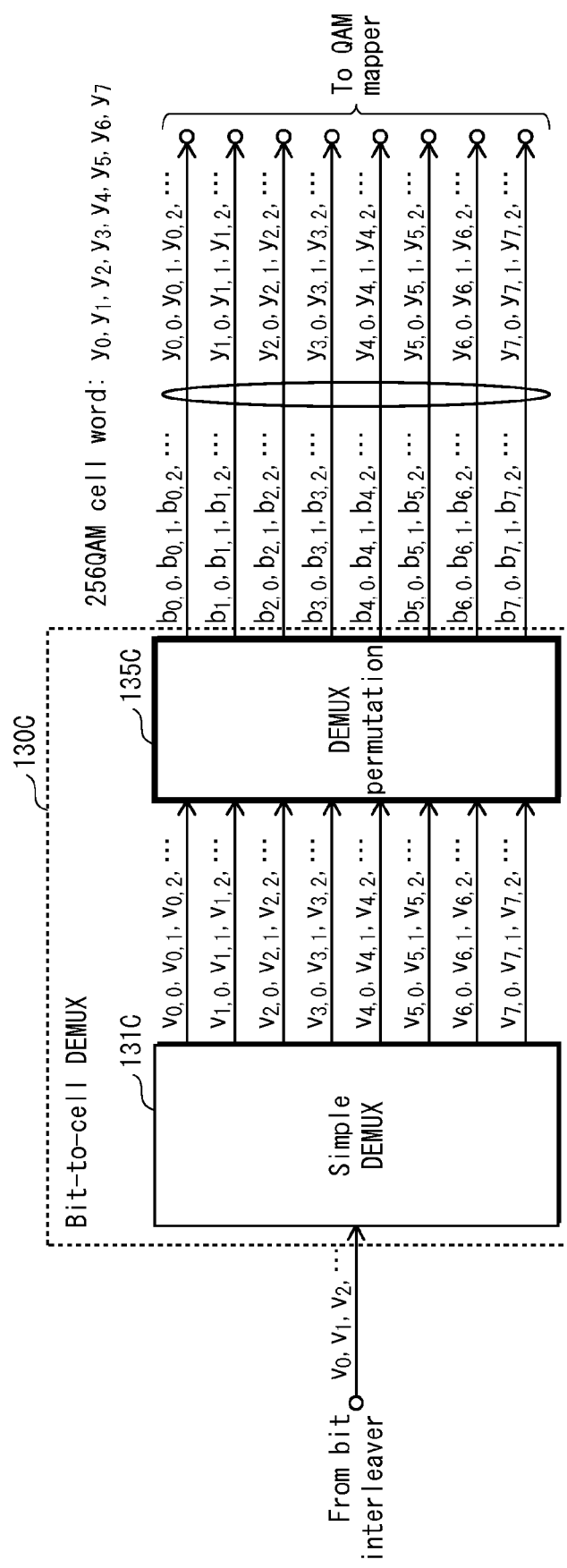
FIG. 19 is a block diagram of a bit-to-cell demultiplexer for 256QAM constellation.

FIG. 19 is a block diagram of the bit-to-cell demultiplexer for 256QAM constellation. Note that FIG. 19 specifically refers to the case for which the number of sub-bitstreams $N_{substreams}=8$, where each sub-bitstream has 16200/8=2025 bits.

The bit-to-cell demultiplexer 130C shown in FIG. 19 includes a simple demultiplexer 131C and a DEMUX permutator 135C.

The simple demultiplexer 131C receives one bit stream ($v_0$, $v_1$, $v_2$, ...) from the bit interleaver 120 and demultiplexes the received bit stream into 8 sub-bitstreams, namely the first sub-bitstream ($v_{0,0}$, $v_{0,1}$, $v_{0,2}$, ...) to the eighth sub-bitstream ($v_{7,0}$, $v_{7,1}$, $v_{7,2}$, ...). The simple demultiplexer 1131C then outputs the resulting 8 sub-bitstreams to the DEMUX permutator 135C. Note that the output bits $v_{i,j}$ of the simple demultiplexer 131C correspond to the input bits $v_{i+8\times j}$ to the simple demultiplexer 131C.

The DEMUX permutator 135C receives the 8 sub-bitstreams from the simple demultiplexer 131C, permutes the 8 sub-bitstreams received, and outputs 8 sub-bitstreams obtained as a result of the permutation. As shown in FIG. 19, the output bits $b_{0,i}$ to $b_{7,i}$ (i=0, 1, 2, ...) of the DEMUX permutator 135C includes one cell word ($y_{0,i}$ to $y_{7,i}$) and the cell word is forwarded to the QAM mapper 1140 for 256QAM.

The cell words obtained as a result of the processing by the bit-to-cell demultiplexer 130 (130A through 130C) are serially output to the QAM mapper 140 shown in FIG. 15. The QAM mapper 140 maps the cell words (the output of the bit-to-cell demultiplexer) to the constellation symbols according to the particular one of 16QAM, 64QAM and 256QAM modulation of FIGS. 12, 13 and 14, i.e. according to the bit labeling used in the DVB-T2 standard.

In the following, demultiplexing parameters will be presented according to various embodiments of the invention for applying permutation schemes for different LDPC codes and different modulation modes. The following permutation is applied in the DEMUX permutator of the bit-to-cell demultiplexer, according to FIGS. 17 through 19, as being part of FIG. 15.

The following describes the permutation rules used by the DEMUX permutator provided in the bit-to-cell demultiplexer, for the following three cases:

Case A: The LDPC encoder uses an LDPC code having a codeword length of 16200 bits and code rate 7/15 as shown in FIG. 25, and the QAM mapper uses a 64QAM constellation;

Case B: The LDPC encoder uses an LDPC code having a codeword length of 16200 bits and code rate 7/15 as shown in FIG. 25, and the QAM mapper uses a 256QAM constellation; and Case C: The LDPC encoder uses an LDPC code having a codeword length of 16200 bits and code rate 8/15 as shown in FIG. 26, and the QAM mapper uses a 64QAM constellation.

(Case A)

The following describes the processing performed by the bit-to-cell demultiplexer 130B shown in FIG. 18, according to one example of the embodiment of the present invention. This example is directed to the case where the LDPC encoder 115 uses the LDPC code having a codeword length of 16200 and code rate 7/15 as shown in FIG. 25, and the QAM mapper 140 uses a 64QAM modulation as the modulation scheme.

The permutation in the DEMUX permutator 135B is performed as depicted in FIG. 18 on the 12 bits of a row of the interleaver matrix that is read out row-wise and then demultiplexed according to FIG. 18.

After the demultiplexing process, the DEMUX permutator 135B permutes the 12 input bits $v_{di}$ ($v_{di,do}$) to the 12 output bits $b_e$ ($b_{e,do}$) according to the following permutation rule.

The permutation rule is $v_0=b_2$, $v_1=b_4$, $v_2=b_0$, $v_3=b_1$, $v_4=b_3$, $v_5=b_6$, $v_6=b_5$, $v_7=b_8$, $v_8=b_{10}$, $v_9=b_7$, $v_{10}=b_{11}$, $v_{11}=b_9$.

After performing the above permutation, two cell words are extracted for each $b_e$. The two bit-to-cell words $y_0$-$y_5$ are output to the QAM mapper 140 of the 64QAM type for being mapped to two consecutive modulation symbols.

(Case B)

The following describes the processing performed by the bit-to-cell demultiplexer 130C shown in FIG. 19, according to another example of the embodiment of the present invention. This example is directed to the case where the LDPC encoder 115 uses the LDPC code having a codeword length of 16200 and code rate 7/15 as shown in FIG. 25, and the QAM mapper 140 uses a 256QAM modulation as the modulation scheme.

The permutation in the DEMUX permutator 135C is performed as depicted in FIG. 19 on the 8 bits of a row of the interleaver matrix that is read out row-wise and then demultiplexed according to FIG. 19.

After the demultiplexing process, the DEMUX permutator 135C permutes the 8 input bits $v_{di}$ ($v_{di,do}$) to the 8 output bits $b_e$ ($b_{e,do}$) according to the following permutation rule.

That is, the permutation rule is $v_0=b_2$, $v_1=b_6$, $v_2=b_0$, $v_3=b_1$, $v_4=b_4$, $v_5=b_5$, $v_6=b_3$, $v_7=b_7$.

After performing the above permutation, one cell word is extracted for each $b_e$. The bit-to-cell word $y_0$-$y_7$ is output to the QAM mapper 140 of the 256QAM type for being mapped to two consecutive modulation symbols.

(Case C)

The following describes the processing performed by the bit-to-cell demultiplexer 130B shown in FIG. 18, according to yet another example of the embodiment of the present invention. This example is directed to the case where the LDPC encoder 115 uses the LDPC code having a codeword length of 16200 and code 8/15 as shown in FIG. 26, and the QAM mapper 140 uses a 64QAM modulation as the modulation scheme.

The permutation in the DEMUX permutator 135B is performed as depicted in FIG. 18 on the 12 bits of a row of the interleaver matrix that is read out row-wise and then demultiplexed according to FIG. 18.

After the demultiplexing process, the DEMUX permutator 135B permutes the 12 input bits $v_{di}$ ($v_{di,do}$) to the 12 output bits $b_e$ ($b_{e,do}$) according to the following permutation rule.

The permutation rule is $v_0=b_0$, $v_1=b_4$, $v_2=b_5$, $v_3=b_1$, $v_4=b_6$, $v_5=b_7$, $v_6=b_2$, $v_7=b_{10}$, $v_8=b_3$, $v_9=b_8$, $v_{10}=b_9$, $v_{11}=b_{11}$.

After performing the above permutation, two cell words are extracted for each $b_e$. The two bit-to-cell words $y_0$-$y_5$ are output to the QAM mapper 140 of the 64QAM type for being mapped to two consecutive modulation symbols.

<Receiving Side>

The following describes a BICM decoder according to an embodiment of the present invention, with reference to the drawings. Note that the BICM decoder is provided in a receiver. Examples of apparatuses having the BICM decoder according to this embodiment include handheld devices, mobile phones, tablet PCs, notebooks, televisions, etc.

The processing by the BICM decoder provided in the receiver will basically be the reverse of the above-explained processing performed by the BICM encoder provided in the transmitter. In summary, complex cells will be demodulated according to the constellation mapping (QPSK, 16QAM, 64QAM, 256QAM) to determine the transmitted bit-to-cell words. One cell word (in the case of 256QAM) or two cell words (in the cases of 16QAM and 64QAM) will be bit-permuted according to a permutation rule being inverse to that in the transmitting side, and then multiplexed into a bit stream. The resulting bit stream is subjected to column-row deinterleaving by a column-row deinterleaver, as well as to parity deinterleaving by a parity deinterleaver. Note that bits deinterleaved by the parity deinterleaver are parity bits only. The output bits of the parity deinterleaver are decoded by the LDPC decoder, which is in concordance with the transmitting side LDPC coding. Then, a stream of bits resulting from the decoding is output.

The following describes the BICM decoder in detail.

Figure 20:
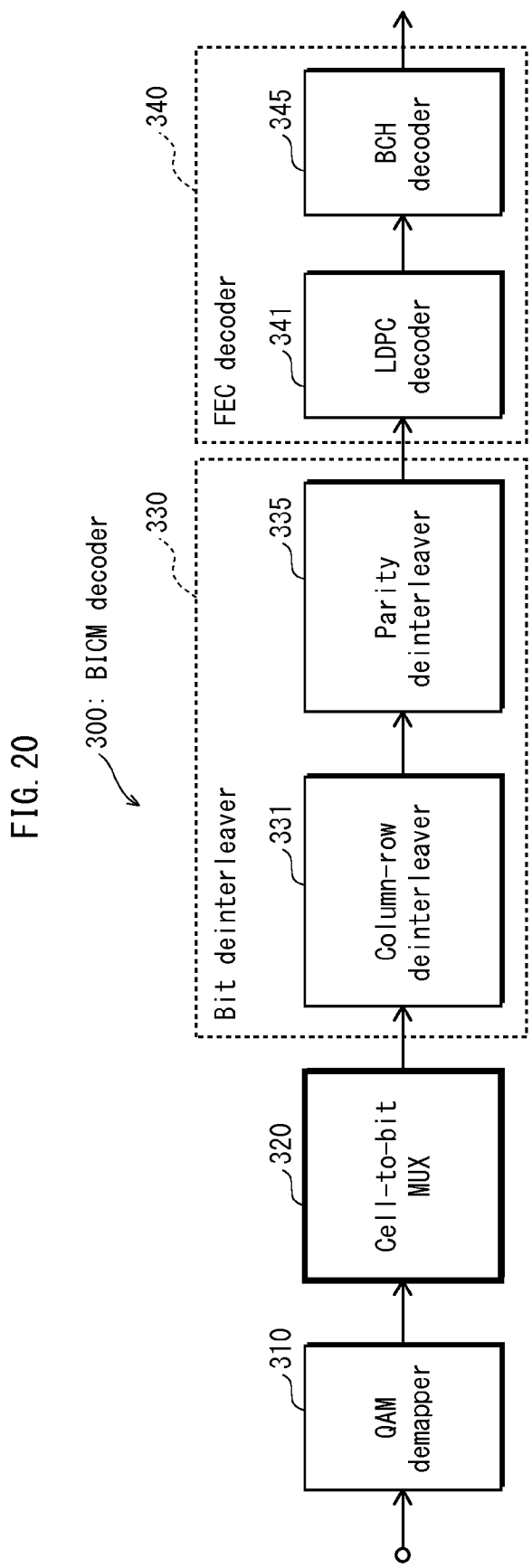
FIG. 20 is a block diagram of a BICM decoder according to an embodiment of the present invention.

FIG. 20 is a block diagram of the BICM decoder according to the embodiment of the present invention.

The BICM decoder 300 shown in FIG. 20 includes a QAM demapper 310, a cell-to-bit multiplexer 320, a bit deinterleaver 330, and an FEC decoder 340.

The QAM demapper 310 demodulates complex cells according to a particular modulation mode (such as 16QAM, 64QAM or 256QAM) and outputs the resulting cell words to the cell-to-bit multiplexer 320. The cell words corresponding to 16QAM, 64QAM, and 256QAM comprise 4, 6 and 8 bits, respectively.

The QAM demodulation performed by the QAM demapper 310 is in accordance with the QAM modulation performed by the QAM mapper 140 provided in the transmitter. If the QAM mapper 140 of the transmitter performs 16QAM modulation according to the DVB-T2 labeling of FIG. 12, the QAM demapper 310 performs demodulation based on the same 16QAM of FIG. 12, to demodulate each modulation symbol (complex cell) into a cell word of 4 bits. The same applies to the all the QAM modulations according to FIGS. 11, 13, and 14.

The cell-to-bit multiplexer 320 includes a permutation block and a multiplexing block. In the receiving side, the permutation block processes the demodulated bits according to a permutation rule depending on the modulation mode and the LDPC code used in the transmitting side (and conversely in the receiving side).

The following now describes the cell-to-bit multiplexer 330 shown in FIG. 20, with reference to FIGS. 21 through 24.

Figure 21:
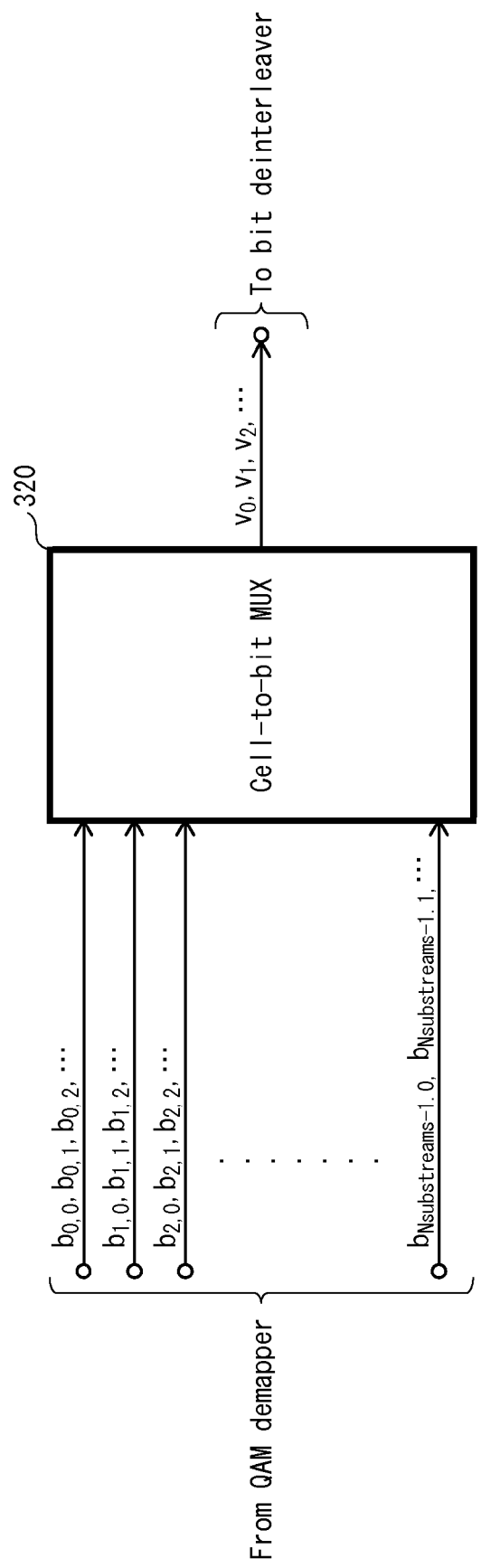
FIG. 21 illustrates the input and output of the cell-to-bit multiplexer shown in FIG. 20.

FIG. 21 illustrates the input and output of the cell-to-bit multiplexer 320 shown in FIG. 20.

The cell words y consisting of input bits b are input to the cell-to-bit multiplexer 320 and are permuted by the cell-to-bit multiplexer 320 to generate output words v.

Figure 22:
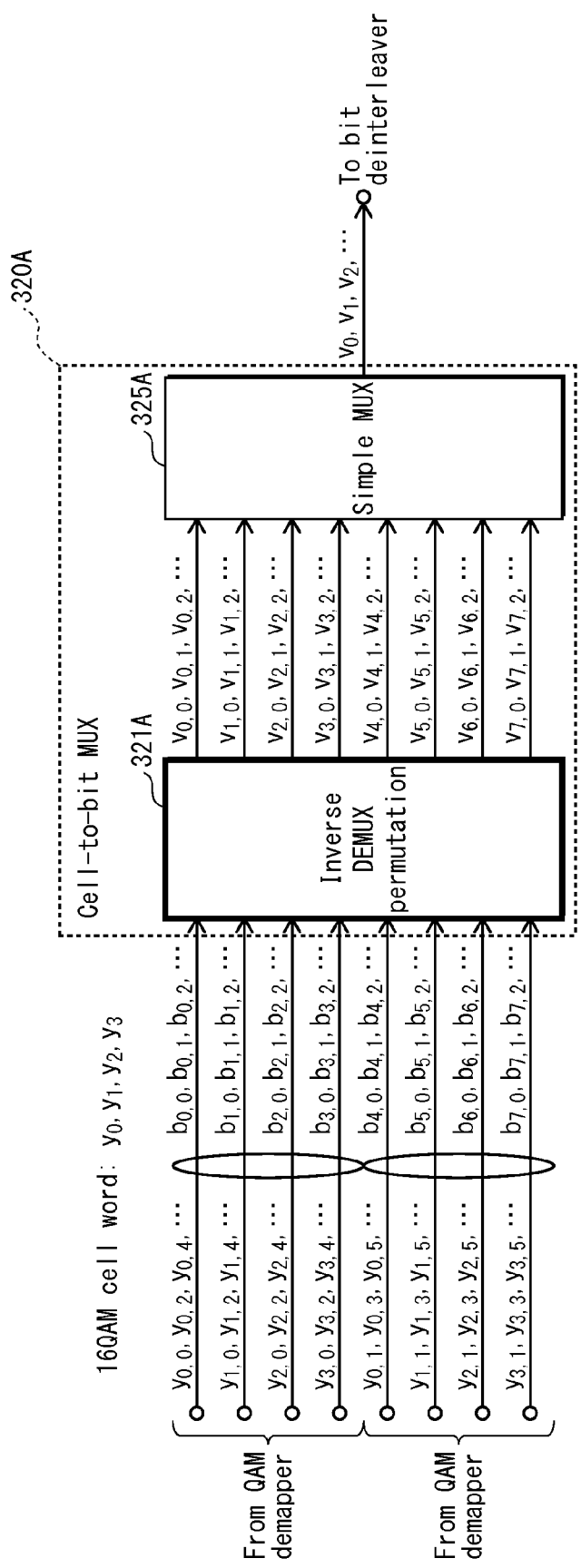
FIG. 22 is a block diagram of a cell-to-bit multiplexer for 16QAM constellation.

FIG. 22 is a block diagram of the cell-to-bit multiplexer for 16QAM constellation.

The cell-to-bit multiplexer 320A shown in FIG. 22 includes an inverse DEMUX permutator 321A and a simple multiplexer 325A.

The inverse DEMUX permutator 321A receives 8 sub-bitstreams (8 bits $b_0$-$b_7$ which form two cell words of 4 bits $y_0$-$y_3$), which are input from the QAM demapper 140 for 16QAM. The inverse DEMUX permutator 321A performs a permutation on the received 8 sub-bitstreams (i.e., a permutation to restore the order of sub-bitstreams that is before the permutation by the DEMUX permutator 135A in the transmitting side) and outputs the resulting 8 sub-bitstreams to the simple multiplexer 325A.

The simple multiplexer 325A multiplexes the 8 sub-bitstreams obtained as a result of the permutation to a single bit-stream of 16200 bits to output. The resulting output bits $v_{i+8 \times j}$ of the simple multiplexer 325A correspond to the input bits $v_{i,j}$ of the simple multiplexer 325A.

Figure 23:
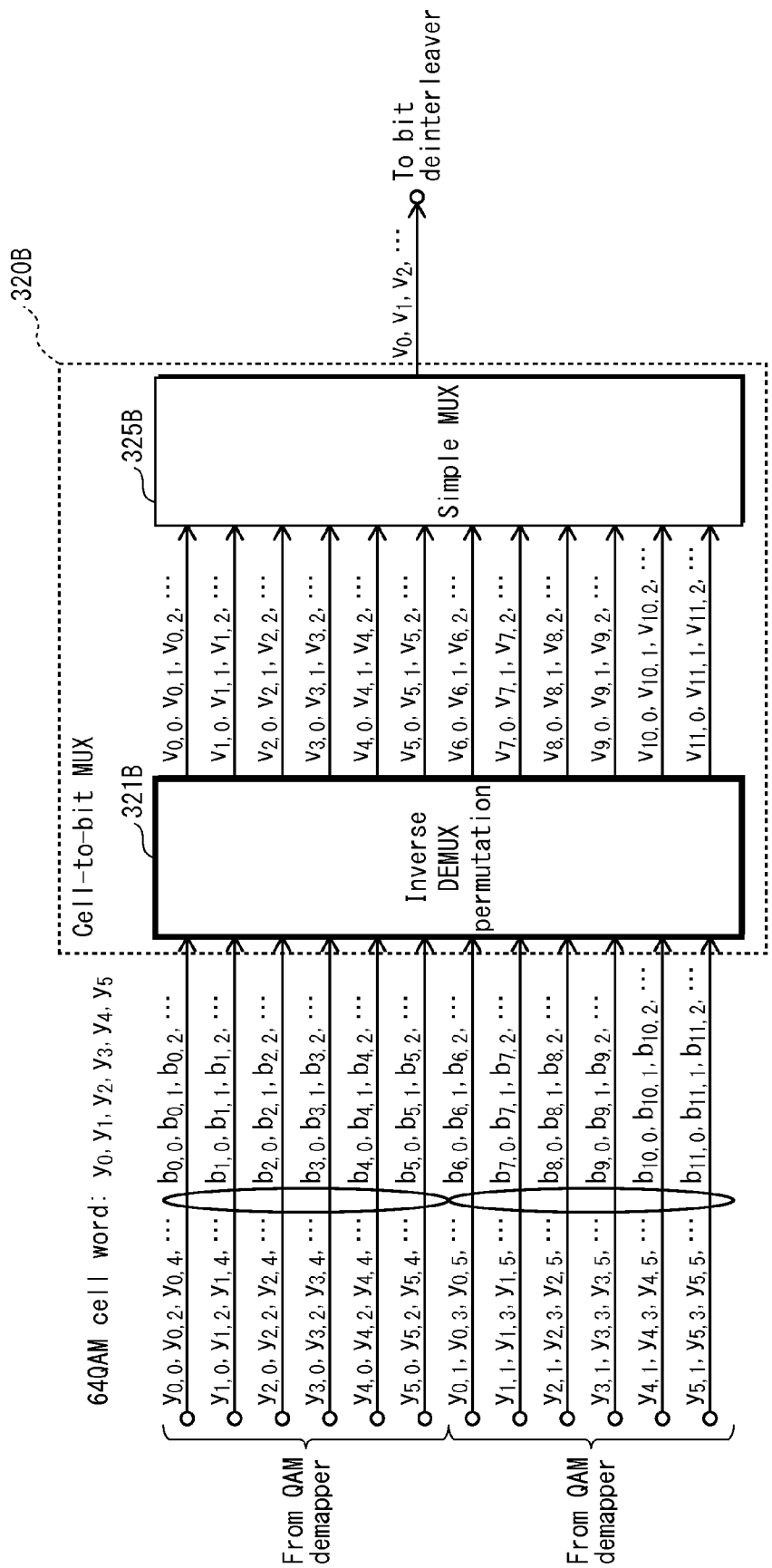
FIG. 23 is a block diagram of a cell-to-bit multiplexer for 64QAM constellation.

FIG. 23 is a block diagram of the cell-to-bit multiplexer for 64QAM constellation.

The cell-to-bit multiplexer 320B shown in FIG. 23 includes an inverse DEMUX permutator 321B and a simple multiplexer 325B.

The inverse DEMUX permutator 321B receives 12 sub-bitstreams (12 bits $b_0$-$b_{11}$ which form two cell words of 6 bits $y_0$-$y_5$), which are input from the QAM demapper 140 for 64QAM. The inverse DEMUX permutator 321B performs a permutation on the received 12 sub-bitstreams (i.e., a permutation to restore the order of sub-bit streams that is before the permutation by the DEMUX permutator 135B in the transmitting side) and outputs the resulting 12 sub-bitstreams to the simple multiplexer 325B.

The simple multiplexer 325B multiplexes the 12 sub-bitstreams obtained as a result of the permutation to a single bit-stream of 16200 bits to output. The resulting output bits $v_{i+12 \times j}$ of the simple multiplexer 325B correspond to the input bits $v_{i,j}$ of the simple multiplexer 325B.

Figure 24:
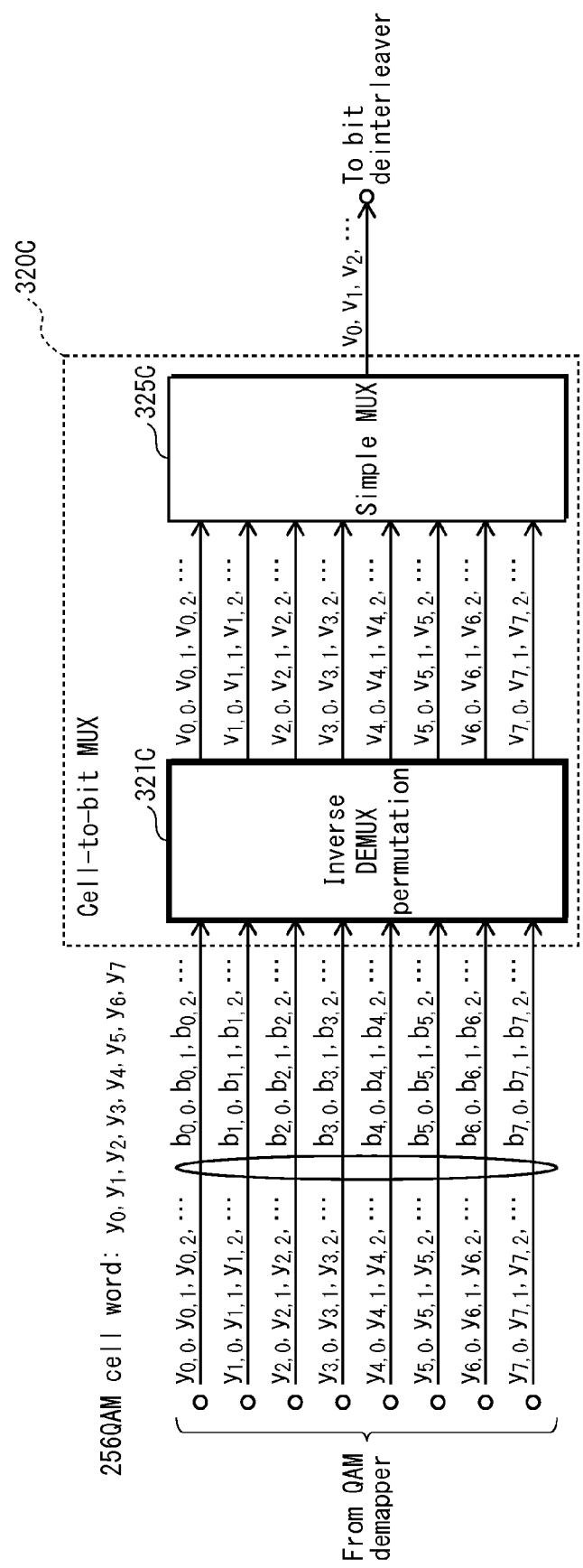
FIG. 24 is a block diagram of a cell-to-bit multiplexer for 256QAM constellation.

FIG. 24 is a block diagram of the cell-to-bit multiplexer for 256QAM constellation.

The cell-to-bit multiplexer 320C shown in FIG. 24 includes an inverse DEMUX permutator 321C and a simple multiplexer 325C.

The inverse DEMUX permutator 321C receives 8 sub-bitstreams (8 bits $b_0$-$b_7$ which form one cell word of 8 bits $y_0$-$y_7$), which are input from the QAM demapper 140 for 256QAM. The inverse DEMUX permutator 321C performs a permutation on the received 8 sub-bitstreams (i.e., a permutation to restore the order of the substreams that is before the permutation by the DEMUX permutator 135C in the transmitting side) and outputs the resulting 8 sub-bitstreams to the simple multiplexer 325C.

The simple multiplexer 325C multiplexes the 8 sub-bitstreams obtained as a result of the permutation to a single bit-stream of 16200 bits to output. The resulting output bits $v_{i+8 \times j}$ of the simple multiplexer 325C correspond to the input bits $v_{i,j}$ of the simple multiplexer 325C.

The details of the permutation rules used by the inverse DEMUX permutator will be described later.

The bit deinterleaver 330 includes a column-row deinterleaver 331 and a parity deinterleaver 335.

The column-row deinterleaver 331 receives a bit stream composed of 16200 bits v ($v_0$, $v_1$, $v_2$ . . . ) from the cell-to-bit multiplexer 320 (320A through 320C). The column-row deinterleaver 331 performs column-row deinterleaving with twist (column twist deinterleaving) on the 16200 input bits received. More specifically, the column-row deinterleaver 331 serially writes the 16200 input bits row-wise into a deinterleaver matrix, and then serially reads out the 16200 bits column-wise from the deinterleaver matrix with twist. In the process of twisting, the read start position of each column is twisted by using the twisting parameter $t_c$ shown in Table 2. The dimensions of the deinterleaver matrix depend on the constellation size used in the demodulation process by the QAM demapper 310 and the codeword length of the LDPC code used in the LDPC demodulation by the LDPC decoder 341. In more detail, in the case of the LDPC code having a codeword length of 16200 bits, the number of columns of the deinterleaver matrix is 8 for 16QAM, resulting in 2025 rows. For 64QAM the number of columns is 12, resulting in 1350 rows. For 256QAM the number of columns is 8, resulting in 2025 rows.

Note that the values of the twisting parameter $t_c$ used by the column-row deinterleaver 331 are the same as the values of twisting parameter $t_c$ used by the column-row interleaver 125. Note that the column-row interleaver 125 may perform column-row interleaving without twist. In such a case, the column-row deinterleaver 331 performs column-row deinterleaving without twist.

The parity deinterleaver 335 performs parity deinterleaving to permute the order of the LDPC parity bits out of the bits input from the column-row deinterleaver 331 (i.e., a to restore the order of the bits before the permutation by the parity interleaver 121 in the transmitting side) (see Equation 5).

The FEC decoder 340 includes the LDPC decoder 341 and a BCH decoder 345. Note that the contents described in the "Supplement 2" section is also applicable to a system in which the BCH decoder 345 downstream of the LDPC decoder 341 is omitted or replaced with a decoder for different code.

The LDPC decoder 341 performs the demodulation using the LDPC code used by the LDPC encoder 115 of the transmitter shown in FIG. 15. More specifically, an LDPC code having a codeword length of 16200 bits with code rate 7/15 according to FIG. 25 or an LDPC code having a codeword length of 16200 bits with code rate 8/15 according to FIG. 26 is used in the demodulation.

The BCH decoder 345 performs a BCH decoding process on the data resulting from the demodulation by the LDPC decoder 341.

The following describes in detail the permutation rules used by the MUX permutator provided in the cell-to-bit multiplexer, for the following three cases.

Case A: The LDPC decoder uses an LDPC code having a codeword length of 16200 bits and code rate 7/15 as shown in FIG. 25, and the QAM demapper performs a 64QAM demodulation.

Case B: The LDPC decoder uses an LDPC code having a codeword length of 16200 bits and code rate 7/15 as shown in FIG. 25, and the QAM demapper performs a 256QAM demodulation.

Case C: The LDPC decoder uses an LDPC code having a codeword length of 16200 bits and code rate 8/15 as shown in FIG. 26, and the QAM demapper uses a 64QAM demodulation.

(Case A)

The following describes the processing performed by the cell-to-bit multiplexer 320B shown in FIG. 23, according to one example of the embodiment of the present invention. Note that this example is directed to the case where the LDPC decoder 341 uses the uses the LDPC code having a codeword length of 16200 and code rate 7/15 as shown in FIG. 25, and the QAM demapper 310 performs 64QAM demodulation.

The permutation by the inverse DEMUX permutator 321B is performed as illustrated in FIG. 23 on 12 bits that are serially input from the QAM demapper 310.

In the permutation process, the inverse DEMUX permutator 321B permutes two cell words composed of 12 input bits $b_e$ ($b_{e,do}$) to the 12 output bits $v_{di}$ ($v_{di,do}$) according to the following permutation rule.

The permutation rule is $v_0=b_2, v_1=b_4, v_2=b_0, v_3=b_1, v_4=b_3, v_5=b_6, v_6=b_5, v_7=b_8, v_8=b_{10}, v_9=b_7, v_{10}=b_{11}, v_{11}=b_9$.

The thus permuted bits v are multiplexed by the simple multiplexer 325B.

(Case B)

The following describes the processing performed by the cell-to-bit multiplexer 320C shown in FIG. 24, according to another example of the embodiment of the present invention. Note that this embodiment is directed to the case where the LDPC decoder 341 uses the uses the LDPC code having a codeword length of 16200 and code rate 7/15 as shown in FIG. 25, and the QAM demapper 310 performs 256QAM demodulation.

The permutation by the inverse DEMUX permutator 321B is performed as illustrated in FIG. 24 on 8 bits that are serially input from the QAM demapper 310.

In the permutation process, the inverse DEMUX permutator 321C permutes one cell word composed of 8 input bits $b_e$ ($b_{e,do}$) to the 8 output bits $v_{di}$ ($v_{di,do}$) according to the following permutation rule.

That is, the permutation rule is $v_0=b_2, v_1=b_6, v_2=b_0, v_3=b_1, v_4=b_4, v_5=b_5, v_6=b_3, v_7=b_7$.

The thus permuted bits v are multiplexed by the simple multiplexer 325C.

(Case C)

The following describes the processing performed by the cell-to-bit multiplexer 320B shown in FIG. 23, according to yet another example of the embodiment of the present invention. Note that this example is directed to the case where the LDPC decoder 341 uses the uses the LDPC code having a codeword length of 16200 and code rate 8/15 as shown in FIG. 26, and the QAM demapper 310 performs 64QAM demodulation.

The permutation by the inverse DEMUX permutator 321B is performed as illustrated in FIG. 23 on 12 bits that are serially input from the QAM demapper 310.

In the permutation process, the inverse DEMUX permutator 321B permutes two cell words composed of 12 input bits $b_e$ ($b_{e,do}$) to the 12 output bits $v_{di}$ ($v_{di,do}$) according to the following permutation rule.

The permutation rule is $v_0=b_0, v_1=b_4, v_2=b_5, v_3=b_1, v_4=b_6, v_5=b_7, v_6=b_2, v_7=b_{10}, v_8=b_3, v_9=b_8, v_{10}=b_9, v_{11}=b_{11}$.

The thus permuted bits v are multiplexed by the simple multiplexer 325B.

The permutation rules used by the DEMUX permutators 135B and 135C shown in FIGS. 18 and 19 as well as by the inverse DEMUX permutators 321B and 325C shown in FIGS. 23 and 24 are listed in Table 3 below.

TABLE 3

| | Modulation scheme | |
|---|---|---|
| LDPC Code Rate | 64QAM | 256QAM |
| LDPC Code Rate 7/15 | 2 4 0 1 3 6 5 8 10 7 11 9 | 2 6 0 1 4 5 3 7 |
| LDPC Code Rate 8/15 | 0 4 5 1 6 7 2 10 3 8 9 11 | — |

The above expiations given in the "Findings by Present Inventor Leading to the Invention" section are intended to better understand the contents of the "Supplement 2" section and should not be understood as limiting the invention to the described specific implementations of processes and functions in the mobile communication network. Nevertheless, the improvements proposed in the embodiments may be readily applied in the architectures/systems described in the "Findings by Present Inventor Leading to the Invention" section and may in some embodiments of the invention also make use of standard and improved procedures of theses architectures/systems. It would be appreciated by a person skilled in the art that numerous variations and/or modifications may be made to the present invention as shown in the "Supplement 2" section without departing from the spirit or scope of the invention as broadly described.

Supplement 1

The present invention is not limited to the specific embodiments described above. Provided that the aims of the present invention and accompanying aims are achieved, other variations are also possible, such as the following.

(1) The various embodiments described above may relate to the implementation using hardware and software. It is recognized that the various embodiments described above may be implemented or performed using computing devices (processors). A computing device or processor may for example be main processors/general purpose processors, digital signal processors (DSP), application specific integrated circuits (ASIC), field programmable gate arrays (FPGA) or other programmable logic devices, etc. The various embodiments of the invention may also be performed or embodied by a combination of these devices.

(2) Further, the various embodiments described above may also be implemented by means of software modules, which are executed by a processor or directly in hardware. Also a combination of software modules and a hardware implementation may be possible. The software modules may be stored on any kind of computer readable storage media, for example RAM, EPROM, EEPROM, flash memory, registers, hard disks, CD-ROM, DVD, etc.

Supplement 2

The following describes the transmission processing method, transmitter, reception processing method, and receiver according to embodiments of the present invention along with their advantageous effects.

(1) A first transmission processing method includes:

an encoding step of encoding information bits into a codeword according to a low density parity check code with code rate 7/15 and a codeword length of 16200, the low density parity check code shown in FIG. 25;

a bit-interleaving step of conducting parity interleaving and column-row interleaving on bits of the codeword obtained in the encoding step, the column-row interleaving being conducted with or without twist;

a bit-to-cell demultiplexing step of demultiplexing a sequence of bits interleaved in the bit-interleaving step into 12 sequences of bits and permuting the 12 sequences of bits according to a predetermined permutation rule; and a mapping step of mapping each of 6-bit cell words obtained in the bit-to-cell demultiplexing step, according to a 64QAM (Quadrature Amplitude Modulation) constellation, wherein letting $v_i$ denote a bit in the $i^{th}$ sequence of bits before the permutation (for i=0, 1, ... 11), and letting $b_i$ denote a bit in the $i^{th}$ sequence of bits after the permutation (for i=0, 1, ... 11), the predetermined permutation rule is:

$v_0=b_2$, $v_1=b_4$, $v_2=b_0$, $v_3=b_1$, $v_4=b_3$, $v_5=b_6$, $v_6=b_5$, $v_7=b_8$, $v_8=b_{10}$, $v_9=b_7$, $v_{10}=b_{11}$, $v_{11}=b_9$.

A first transmitter includes:

an encoder adapted to encode information bits into a codeword according to a low density parity check code with code rate 7/15 and a codeword length of 16200, the low density parity check code shown in FIG. 25;

a bit-interleaver adapted to conduct parity interleaving and column-row interleaving on bits of the codeword obtained by the encoder, the column-row interleaving being conducted with or without twist;

a bit-to-cell demultiplexer adapted to demultiplex a sequence of bits interleaved by the bit-interleaver into 12 sequences of bits and permute the 12 sequences of bits according to a predetermined permutation rule; and a mapper adapted to map each of 6-bit cell words obtained by the bit-to-cell demultiplexer, according to a 64QAM (Quadrature Amplitude Modulation) constellation, wherein letting $v_i$ denote a bit in the $i^{th}$ sequence of bits before the permutation (for i=0, 1, ... 11), and letting $b_i$ denote a bit in the $i^{th}$ sequence of bits after the permutation (for i=0, 1, ... 11), the predetermined permutation rule is:

$v_0=b_2$, $v_1=b_4$, $v_2=b_0$, $v_3=b_1$, $v_4=b_3$, $v_5=b_6$, $v_6=b_5$, $v_7=b_8$, $v_8=b_{10}$, $v_9=b_7$, $v_{10}=b_{11}$, $v_{11}=b_9$.

A first reception processing method includes:

a demapping step of demapping complex cells according to a 64QAM (Quadrature Amplitude Modulation) constellation;

a cell-to-bit multiplexing step of permuting 12 sequences of bits obtained in the demapping step, according to a predetermined permutation rule and multiplexing 12 sequences of bits obtained as a result of the permutation into one sequence of bits;

a bit-deinterleaving step of conducting column-row deinterleaving and parity deinterleaving on the one sequence of bits obtained as a result of the multiplexing, the column-row deinterleaving being conducted with or without twist; and a decoding step of decoding bits deinterleaved in the bit-deinterleaving step, according to a low density parity check code with code rate 7/15 and a codeword length of 16200, the low density parity check code shown in FIG. 25;

wherein letting $b_i$ denote a bit in the $i^{th}$ sequence of bits before the permutation (for i=0, 1, ... 11), and letting $v_i$ denote a bit in the $i^{th}$ sequence of bits after the permutation (for i=0, 1, ... 11), the predetermined permutation rule is:

$v_0=b_2$, $v_1=b_4$, $v_2=b_0$, $v_3=b_1$, $v_4=b_3$, $v_5=b_6$, $v_6=b_5$, $v_7=b_8$, $v_8=b_{10}$, $v_9=b_7$, $v_{10}=b_{11}$, $v_{11}=b_9$.

A first receiver includes:

a demapper adapted to demap complex cells according to a 64QAM (Quadrature Amplitude Modulation) constellation;

a cell-to-bit multiplexer adapted to permute 12 sequences of bits obtained by the demapper step, according to a predetermined permutation rule and multiplex 12 sequences of bits obtained as a result of the permutation into one sequence of bits;

a bit deinterleaver adapted to conduct column-row deinterleaving and parity deinterleaving on the one sequence of bits obtained as a result of the multiplexing, the column-row deinterleaving being conducted with or without twist; and a decoder adapted to decode bits deinterleaved by the bit deinterleaver, according to a low density parity check code with code rate 7/15 and a codeword length of 16200, the low density parity check code shown in FIG. 25;

wherein letting $b_i$ denote a bit in the $i^{th}$ sequence of bits before the permutation (for i=0, 1, ... 11), and letting $v_i$ denote a bit in the $i^{th}$ sequence of bits after the permutation (for i=0, 1, ... 11), the predetermined permutation rule is:

$v_0=b_2$, $v_1=b_4$, $v_2=b_0$, $v_3=b_1$, $v_4=b_3$, $v_5=b_6$, $v_6=b_5$, $v_7=b_8$, $v_8=b_{10}$, $v_9=b_7$, $v_{10}=b_{11}$, $v_{11}=b_9$.

According to the transmission processing method as well as the transmitter described above, the permutation rules to be applied to the LDPC codeword bits prior to being mapped are optimized for the LDPC codes and constellations used by the transmitter and receiver, which is advantageous to improve the reception performance of the receiver.

According to the reception processing method as well as the receiver described above, the permutation rules to be applied to the bits obtained as a result of demapping are optimized for the LDPC codes and constellations used by the transmitter and receiver, which is advantageous to improve the reception performance of the receiver.

(2) A second transmission processing method includes:

an encoding step of encoding information bits into a codeword according to a low density parity check code with code rate 7/15 and a codeword length of 16200, the low density parity check code shown in FIG. 25;

a bit-interleaving step of conducting parity interleaving and column-row interleaving on bits of the codeword obtained in the encoding step, the column-row interleaving being conducted with or without twist;

a bit-to-cell demultiplexing step of demultiplexing a sequence of bits interleaved in the bit-interleaving step into 8 sequences of bits and permuting the 8 sequences of bits according to a predetermined permutation rule; and a mapping step of mapping each of 8-bit cell words obtained in the bit-to-cell demultiplexing step, according to a 256QAM (Quadrature Amplitude Modulation) constellation, wherein letting $v_i$ denote a bit in the $i^{th}$ sequence of bits before the permutation (for i=0, 1, . . . 7), and letting $b_i$ denote a bit in the $i^{th}$ sequence of bits after the permutation (for i=0, 1, . . . 7), the predetermined permutation rule is:

$v_0=b_2, v_1=b_6, v_2=b_0, v_3=b_1, v_4=b_4, v_5=b_5, v_6=b_3, v_7=b_7$.

A second transmitter includes:

an encoder adapted to encode information bits into a codeword according to a low density parity check code with code rate 7/15 and a codeword length of 16200, the low density parity check code shown in FIG. 25;

a bit-interleaver adapted to conduct parity interleaving and column-row interleaving on bits of the codeword obtained by the encoder, the column-row interleaving being conducted with or without twist;

a bit-to-cell demultiplexer adapted to demultiplex a sequence of bits interleaved by the bit-interleaver into 8 sequences of bits and permute the 8 sequences of bits according to a predetermined permutation rule; and a mapper adapted to map each of 8-bit cell words obtained by the bit-to-cell demultiplexer, according to a 256QAM (Quadrature Amplitude Modulation) constellation, wherein letting $v_i$ denote a bit in the $i^{th}$ sequence of bits before the permutation (for i=0, 1, . . . 7), and letting $b_i$ denote a bit in the $i^{th}$ sequence of bits after the permutation (for i=0, 1, . . . 7), the predetermined permutation rule is:

$v_0=b_2, v_1=b_6, v_2=b_0, v_3=b_1, v_4=b_4, v_5=b_5, v_6=b_3, v_7=b_7$.

A second reception processing method includes:

a demapping step of demapping complex cells according to a 256QAM (Quadrature Amplitude Modulation) constellation;

a cell-to-bit multiplexing step of permuting 8 sequences of bits obtained in the demapping step, according to a predetermined permutation rule and multiplexing 8 sequences of bits obtained as a result of the permutation into one sequence of bits;

a bit-deinterleaving step of conducting column-row deinterleaving and parity deinterleaving on the one sequence of bits obtained as a result of the multiplexing, the column-row deinterleaving being conducted with or without twist; and a decoding step of decoding bits deinterleaved in the bit-deinterleaving step, according to a low density parity check code with code rate 7/15 and a codeword length of 16200, the low density parity check code shown in FIG. 25;

wherein letting $b_i$ denote a bit in the $i^{th}$ sequence of bits before the permutation (for i=0, 1, . . . 7), and letting $v_i$ denote a bit in the $i^{th}$ sequence of bits after the permutation (for i=0, 1, . . . 7), the predetermined permutation rule is:

$v_0=b_2, v_1=b_6, v_2=b_0, v_3=b_1, v_4=b_4, v_5=b_5, v_6=b_3, v_7=b_7$.

A second receiver includes:

a demapper adapted to demap complex cells according to a 256QAM (Quadrature Amplitude Modulation) constellation;

a cell-to-bit multiplexer adapted to permute 8 sequences of bits obtained by the demapper, according to a predetermined permutation rule and multiplex 8 sequences of bits obtained as a result of the permutation into one sequence of bits;

a bit deinterleaver adapted to conduct column-row deinterleaving and parity deinterleaving on the one sequence of bits obtained as a result of the multiplexing, the column-row deinterleaving being conducted with or without twist; and a decoder adapted to decode bits deinterleaved by the bit deinterleaver, according to a low density parity check code with code rate 7/15 and a codeword length of 16200, the low density parity check code shown in FIG. 25;

wherein letting $b_i$ denote a bit in the $i^{th}$ sequence of bits before the permutation (for i=0, 1, . . . 7), and letting $v_i$ denote a bit in the $i^{th}$ sequence of bits after the permutation (for i=0, 1, . . . 7), the predetermined permutation rule is:

$v_0=b_2, v_1=b_6, v_2=b_0, v_3=b_1, v_4=b_4, v_5=b_5, v_6=b_3, v_7=b_7$.

According to the transmission processing method as well as the transmitter described above, the permutation rules to be applied to the LDPC codeword bits prior to being mapped are optimized for the LDPC codes and constellations used by the transmitter and receiver, which is advantageous to improve the reception performance of the receiver.

According to the reception processing method as well as the receiver described above, the permutation rules to be applied to the bits obtained as a result of demapping are optimized for the LDPC codes and constellations used by the transmitter and receiver, which is advantageous to improve the reception performance of the receiver.

(3) A third transmission processing method includes:

an encoding step of encoding information bits into a codeword according to a low density parity check code with code rate 8/15 and a codeword length of 16200, the low density parity check code shown in FIG. 26;

a bit-interleaving step of conducting parity interleaving and column-row interleaving on bits of the codeword obtained in the encoding step, the column-row interleaving being conducted with or without twist;

a bit-to-cell demultiplexing step of demultiplexing a sequence of bits interleaved in the bit-interleaving step into 12 sequences of bits and permuting the 12 sequences of bits according to a predetermined permutation rule; and a mapping step of mapping each of 6-bit cell words obtained in the bit-to-cell demultiplexing step, according to a 64QAM (Quadrature Amplitude Modulation) constellation, wherein letting $v_i$ denote a bit in the $i^{th}$ sequence of bits before the permutation (for i=0, 1, . . . 11), and letting $b_i$ denote a bit in the $i^{th}$ sequence of bits after the permutation (for i=0, 1, . . . 11), the predetermined permutation rule is:

$v_0=b_0, v_1=b_4, v_2=b_5, v_3=b_1, v_4=b_6, v_5=b_7, v_6=b_2, v_7=b_{10}, v_8=b_3, v_9=b_8, v_{10}=b_9, v_{11}=b_{11}$.

A third transmitter includes:

an encoder adapted to encode information bits into a codeword according to a low density parity check code with code rate 8/15 and a codeword length of 16200, the low density parity check code shown in FIG. 26;

a bit-interleaver adapted to conduct parity interleaving and column-row interleaving on bits of the codeword obtained by the encoder, the column-row interleaving being conducted with or without twist;

a bit-to-cell demultiplexer adapted to demultiplex a sequence of bits interleaved by the bit-interleaver into 12 sequences of bits and permute the 12 sequences of bits according to a predetermined permutation rule; and a mapper adapted to map each of 6-bit cell words obtained by the bit-to-cell demultiplexer, according to a 64QAM (Quadrature Amplitude Modulation) constellation, wherein letting $v_i$ denote a bit in the $i^{th}$ sequence of bits before the permutation (for i=0, 1, . . . 11), and letting $b_i$ denote a bit in the $i^{th}$ sequence of bits after the permutation (for i=0, 1, . . . 11), the predetermined permutation rule is:

$v_0=b_0$, $v_1=b_4$, $v_2=b_5$, $v_3=b_1$, $v_4=b_6$, $v_5=b_7$, $v_6=b_2$, $v_7=b_{10}$, $v_8=b_3$, $v_9=b_8$, $v_{10}=b_9$, $v_{11}=b_{11}$.

A third reception processing method includes:

a demapping step of demapping complex cells according to a 64QAM (Quadrature Amplitude Modulation) constellation;

a cell-to-bit multiplexing step of permuting 12 sequences of bits obtained in the demapping step, according to a predetermined permutation rule and multiplexing 12 sequences of bits obtained as a result of the permutation into one sequence of bits;

a bit-deinterleaving step of conducting column-row deinterleaving and parity deinterleaving on the one sequence of bits obtained as a result of the multiplexing, the column-row deinterleaving being conducted with or without twist; and a decoding step of decoding bits deinterleaved in the bit-deinterleaving step, according to a low density parity check code with code rate 8/15 and a codeword length of 16200, the low density parity check code shown in FIG. 26;

wherein letting $b_i$ denote a bit in the $i^{th}$ sequence of bits before the permutation (for i=0, 1, . . . 11), and letting $v_i$ denote a bit in the $i^{th}$ sequence of bits after the permutation (for i=0, 1, . . . 11), the predetermined permutation rule is:

$v_0=b_0$, $v_1=b_4$, $v_2=b_5$, $v_3=b_1$, $v_4=b_6$, $v_5=b_7$, $v_6=b_2$, $v_7=b_{10}$, $v_8=b_3$, $v_9=b_8$, $v_{10}=b_9$, $v_{11}=b_{11}$.

A third receiver includes:

a demapper adapted to demap complex cells according to a 64QAM (Quadrature Amplitude Modulation) constellation;

a cell-to-bit multiplexer adapted to permute 12 sequences of bits obtained by the demapper, according to a predetermined permutation rule and multiplex 12 sequences of bits obtained as a result of the permutation into one sequence of bits;

a bit deinterleaver adapted to conduct column-row deinterleaving and parity deinterleaving on the one sequence of bits obtained as a result of the multiplexing, the column-row deinterleaving being conducted with or without twist; and a decoder adapted to decode bits deinterleaved by the bit deinterleaver, according to a low density parity check code with code rate 8/15 and a codeword length of 16200, the low density parity check code shown in FIG. 26;

wherein letting $b_i$ denote a bit in the $i^{th}$ sequence of bits before the permutation (for i=0, 1, . . . 11), and letting $v_i$ denote a bit in the $i^{th}$ sequence of bits after the permutation (for i=0, 1, . . . 11), the predetermined permutation rule is:

$v_0=b_0$, $v_1=b_4$, $v_2=b_5$, $v_3=b_1$, $v_4=b_6$, $v_5=b_7$, $v_6=b_2$, $v_7=b_{10}$, $v_8=b_3$, $v_9=b_8$, $v_{10}=b_9$, $v_{11}=b_{11}$.

According to the transmission processing method as well as the transmitter described above, the permutation rules to be applied to the LDPC codeword bits prior to being mapped are optimized for the LDPC codes and constellations used by the transmitter and receiver, which is advantageous to improve the reception performance of the receiver.

According to the reception processing method as well as the receiver described above, the permutation rules to be applied to the bits obtained as a result of demapping are optimized for the LDPC codes and constellations used by the transmitter and receiver, which is advantageous to improve the reception performance of the receiver.

INDUSTRIAL APPLICABILITY

The present invention is applicable to a bit-to-cell demultiplexer in a bit-interleaved coding and modulation system used for low-density parity codes, and also to a bit-to-cell demultiplexer corresponding to such a cell-to-bit multiplexer.

| Reference Signs List | |
|---|---|
| 100 | BICM encoder |
| 110 | FEC encoder |
| 111 | BCH encoder |
| 115 | LDPC encoder |
| 120 | bit interleaver |
| 121 | parity interleaver |
| 125 | column-row interleaver |
| 130 | bit-to-cell demultiplexer |
| 130A-130C | bit-to-cell demultiplexer |
| 131 | simple demultiplexer |
| 131A-131C | simple demultiplexer |
| 135 | DEMUX permutator |
| 135A-135C | DEMUX permutator |
| 140 | QAM mapper |
| 300 | BICM decoder |
| 310 | QAM demapper |
| 320 | cell-to-bit multiplexer |
| 320A-320C | cell-to-bit multiplexer |
| 321 | inverse DEMUX permutator |
| 321A-321C | inverse DEMUX permutator |
| 325 | simple multiplexer |
| 325A-325C | simple multiplexer |
| 330 | bit deinterleaver |
| 331 | column-row deinterleaver |
| 335 | parity deinterleaver |
| 340 | BICM decoder |
| 341 | LDPC decoder |
| 345 | BCH decoder |

The invention claimed is:

1. A transmission processing method comprising:

an encoding step of encoding information bits into a codeword according to a low density parity check code with code rate 7/15 and a codeword length of 16200, the low density parity check code shown in Table 1:

TABLE 1

Addresses of parity bit accumulators for the LDPC code with the code rate 7/15 and the codeword length of 16200

| | | | | |
|---|---|---|---|---|
| 3 | 137 | 314 | 327 | 983 1597 2028 3043 3217 4109 6020 6178 6535 6560 7146 7180 7408 7790 7893 8123 8313 8526 8616 8638 |
| 356 | 1197 | 1208 | 1839 | 1903 2712 3088 3537 4091 4301 4919 5068 6025 6195 6324 6378 6686 6829 7558 7745 8042 8382 8587 8602 |
| 18 | 187 | 1115 | 1417 | 1463 2300 2328 3502 3805 4677 4827 5551 5968 6394 6412 6753 7169 7524 7695 7976 8069 8118 8522 8582 |
| 714 | 2713 | 2726 | 2964 | 3055 3220 3334 3459 5557 5765 5841 6290 6419 6573 6856 7786 7937 8156 8286 8327 8384 8448 8539 8559 |
| 3452 | 7935 | 8092 | 8623 | |
| 56 | 1955 | 3000 | 8242 | |
| 1809 | 4094 | 7991 | 8489 | |
| 2220 | 6455 | 7849 | 8548 | |
| 1006 | 2576 | 3247 | 6976 | |
| 2177 | 6048 | 7795 | 8295 | |
| 1413 | 2595 | 7446 | 8594 | |
| 2101 | 3714 | 7541 | 8531 | |
| 10 | 5961 | 7484 | | |
| 3144 | 4636 | 5282 | | |
| 5708 | 5875 | 8390 | | |
| 3322 | 5223 | 7975 | | |
| 197 | 4653 | 8283 | | |
| 598 | 5393 | 8624 | | |
| 906 | 7249 | 7542 | | |
| 1223 | 2148 | 8195 | | |
| 976 | 2001 | 5005 | | | a bit-interleaving step of conducting parity interleaving and column-row interleaving on bits of the codeword obtained in the encoding step, the column-row interleaving being conducted with or without twist;

a bit-to-cell demultiplexing step of demultiplexing a sequence of bits interleaved in the bit-interleaving step into 8 sequences of bits and permuting the 8 sequences of bits according to a predetermined permutation rule;

a mapping step of mapping each of 8-bit cell words obtained in the bit-to-cell demultiplexing step, according to a 256QAM (Quadrature Amplitude Modulation) constellation, wherein letting $v_i$ denote a bit in the $i^{th}$ sequence of bits before the permutation (for i=0, 1, ... 7), and letting $b_i$ denote a bit in the $i^{th}$ sequence of bits after the permutation (for i=0, 1, ... 7), the predetermined permutation rule is:

$v_0=b_2$, $v_1=b_6$, $v_2=b_0$, $v_3=b_1$, $v_4=b_4$, $v_5=b_5$, $v_6=b_3$, $v_7=b_7$.

2. A transmitter comprising:

an encoder adapted to encode information bits into a codeword according to a low density parity check code with code rate 7/15 and a codeword length of 16200, the low density parity check code shown in Table 2:

TABLE 2

Addresses of parity bit accumulators for the LDPC code with the code rate 7/15 and the codeword length of 16200

| | | | | |
|---|---|---|---|---|
| 3 | 137 | 314 | 327 | 983 1597 2028 3043 3217 4109 6020 6178 6535 6560 7146 7180 7408 7790 7893 8123 8313 8526 8616 8638 |
| 356 | 1197 | 1208 | 1839 | 1903 2712 3088 3537 4091 4301 4919 5068 6025 6195 6324 6378 6686 6829 7558 7745 8042 8382 8587 8602 |
| 18 | 187 | 1115 | 1417 | 1463 2300 2328 3502 3805 4677 4827 5551 5968 6394 6412 6753 7169 7524 7695 7976 8069 8118 8522 8582 |
| 714 | 2713 | 2726 | 2964 | 3055 3220 3334 3459 5557 5765 5841 6290 6419 6573 6856 7786 7937 8156 8286 8327 8384 8448 8539 8559 |
| 3452 | 7935 | 8092 | 8623 | |
| 56 | 1955 | 3000 | 8242 | |
| 1809 | 4094 | 7991 | 8489 | |
| 2220 | 6455 | 7849 | 8548 | |
| 1006 | 2576 | 3247 | 6976 | |
| 2177 | 6048 | 7795 | 8295 | |
| 1413 | 2595 | 7446 | 8594 | |
| 2101 | 3714 | 7541 | 8531 | |
| 10 | 5961 | 7484 | | |
| 3144 | 4636 | 5282 | | |
| 5708 | 5875 | 8390 | | |
| 3322 | 5223 | 7975 | | |
| 197 | 4653 | 8283 | | |
| 598 | 5393 | 8624 | | |
| 906 | 7249 | 7542 | | |
| 1223 | 2148 | 8195 | | |
| 976 | 2001 | 5005 | | | a bit-interleaver adapted to conduct parity interleaving and column-row interleaving on bits of the codeword obtained by the encoder, the column-row interleaving being conducted with or without twist;

a bit-to-cell demultiplexer adapted to demultiplex a sequence of bits interleaved by the bit-interleaver into 8 sequences of bits and permute the 8 sequences of bits according to a predetermined permutation rule;

a mapper adapted to map each of 8-bit cell words obtained by the bit-to-cell demultiplexer, according to a 256QAM (Quadrature Amplitude Modulation) constellation, wherein letting $v_i$ denote a bit in the $i^{th}$ sequence of bits before the permutation (for i=0, 1, ... 7), and letting $b_i$ denote a bit in the $i^{th}$ sequence of bits after the permutation (for i=0, 1, ... 7), the predetermined permutation rule is:
$v_0=b_2, v_1=b_6, v_2=b_0, v_3=b_1, v_4=b_4, v_5=b_5, v_6=b_3, v_7=b_7$.

3. A reception processing method comprising:
a demapping step of demapping complex cells according to a 256QAM (Quadrature Amplitude Modulation) constellation;
a cell-to-bit multiplexing step of permuting 8 sequences of bits obtained in the demapping step, according to a predetermined permutation rule and multiplexing 8 sequences of bits obtained as a result of the permutation into one sequence of bits;
a bit-deinterleaving step of conducting column-row deinterleaving and parity deinterleaving on the one sequence of bits obtained as a result of the multiplexing, the column-row deinterleaving being conducted with or without twist;
a decoding step of decoding bits deinterleaved in the bit-deinterleaving step, according to a low density parity check code with code rate 7/15 and a codeword length of 16200, the low density parity check code shown in Table 3:

letting $v_i$ denote a bit in the $i^{th}$ sequence of bits after the permutation (for i=0, 1, . . . 7),
the predetermined permutation rule is:
$v_0=b_2, v_1=b_6, v_2=b_0, v_3=b_1, v_4=b_4, v_5=b_5, v_6=b_3, v_7=b_7$.

4. A receiver comprising:
a demapper adapted to demap complex cells according to a 256QAM (Quadrature Amplitude Modulation) constellation;
a cell-to-bit multiplexer adapted to permute 8 sequences of bits obtained by the demapper, according to a predetermined permutation rule and multiplex 8 sequences of bits obtained as a result of the permutation into one sequence of bits;
a bit deinterleaver adapted to conduct column-row deinterleaving and parity deinterleaving on the one sequence of bits obtained as a result of the multiplexing, the column-row deinterleaving being conducted with or without twist;
a decoder adapted to decode bits deinterleaved by the bit deinterleaver, according to a low density parity check

TABLE 3

Addresses of parity bit accumulators for the LDPC code with the code rate 7/15 and the codeword length of 16200

| 3 | 137 | 314 | 327 | 983 1597 2028 3043 3217 4109 6020 6178 6535 6560 7146 7180 7408 7790 7893 8123 8313 8526 8616 8638 |
| 356 | 1197 | 1208 | 1839 | 1903 2712 3088 3537 4091 4301 4919 5068 6025 6195 6324 6378 6686 6829 7558 7745 8042 8382 8587 8602 |
| 18 | 187 | 1115 | 1417 | 1463 2300 2328 3502 3805 4677 4827 5551 5968 6394 6412 6753 7169 7524 7695 7976 8069 8118 8522 8582 |
| 714 | 2713 | 2726 | 2964 | 3055 3220 3334 3459 5557 5765 5841 6290 6419 6573 6856 7786 7937 8156 8286 8327 8384 8448 8539 8559 |
| 3452 | 7935 | 8092 | 8623 | |
| 56 | 1955 | 3000 | 8242 | |
| 1809 | 4094 | 7991 | 8489 | |
| 2220 | 6455 | 7849 | 8548 | |
| 1006 | 2576 | 3247 | 6976 | |
| 2177 | 6048 | 7795 | 8295 | |
| 1413 | 2595 | 7446 | 8594 | |
| 2101 | 3714 | 7541 | 8531 | |
| 10 | 5961 | 7484 | | |
| 3144 | 4636 | 5282 | | |
| 5708 | 5875 | 8390 | | |
| 3322 | 5223 | 7975 | | |
| 197 | 4653 | 8283 | | |
| 598 | 5393 | 8624 | | |
| 906 | 7249 | 7542 | | |
| 1223 | 2148 | 8195 | | |
| 976 | 2001 | 5005 | | | wherein
letting $b_i$ denote a bit in the $i^{th}$ sequence of bits before the permutation (for i=0, 1, . . . 7), and code with code rate 7/15 and a codeword length of 16200, the low density parity check code shown in Table 4;

TABLE 4

Addresses of parity bit accumulators for the LDPC code with the code rate 7/15 and the codeword length of 16200

| 3 | 137 | 314 | 327 | 983 1597 2028 3043 3217 4109 6020 6178 6535 6560 7146 7180 7408 7790 7893 8123 8313 8526 8616 8638 |
| 356 | 1197 | 1208 | 1839 | 1903 2712 3088 3537 4091 4301 4919 5068 6025 6195 6324 6378 6686 6829 7558 7745 8042 8382 8587 8602 |
| 18 | 187 | 1115 | 1417 | 1463 2300 2328 3502 3805 4677 4827 5551 5968 6394 6412 6753 7169 7524 7695 7976 8069 8118 8522 8582 |
| 714 | 2713 | 2726 | 2964 | 3055 3220 3334 3459 5557 5765 5841 6290 6419 6573 6856 7786 7937 8156 8286 8327 8384 8448 8539 8559 |
| 3452 | 7935 | 8092 | 8623 | |
| 56 | 1955 | 3000 | 8242 | |
| 1809 | 4094 | 7991 | 8489 | |
| 2220 | 6455 | 7849 | 8548 | |
| 1006 | 2576 | 3247 | 6976 | |
| 2177 | 6048 | 7795 | 8295 | |
| 1413 | 2595 | 7446 | 8594 | |
| 2101 | 3714 | 7541 | 8531 | |
| 10 | 5961 | 7484 | | |
| 3144 | 4636 | 5282 | | |
| 5708 | 5875 | 8390 | | |
| 3322 | 5223 | 7975 | | |
| 197 | 4653 | 8283 | | |
| 598 | 5393 | 8624 | | |

TABLE 4-continued

Addresses of parity bit accumulators for the LDPC code with the code rate 7/15 and the codeword length of 16200

| | | |
|---|---|---|
| 906 | 7249 | 7542 |
| 1223 | 2148 | 8195 |
| 976 | 2001 | 5005 | wherein letting $b_i$ denote a bit in the $i^{th}$ sequence of bits before the permutation (for i=0, 1, ... 7), and letting $v_i$ denote a bit in the $i^{th}$ sequence of bits after the permutation (for i=0, 1, ... 7), the predetermined permutation rule is:

$v_0=b_2, v_1=b_6, v_2=b_0, v_3=b_1, v_4=b_4, v_5=b_5, v_6=b_3, v_7=b_7$.

* * * * *